(12) United States Patent
Narematsu

(10) Patent No.: US 12,157,392 B2
(45) Date of Patent: Dec. 3, 2024

(54) BATTERY CONTROL SYSTEM, BATTERY CONTROL METHOD, BATTERY CONTROL PROGRAM, AND VEHICLE

(71) Applicant: TOYOTA JIDOSHA KABUSHIKI KAISHA, Toyota (JP)

(72) Inventor: Tomohiro Narematsu, Nisshin (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 504 days.

(21) Appl. No.: 17/455,488

(22) Filed: Nov. 18, 2021

(65) Prior Publication Data

US 2022/0219565 A1 Jul. 14, 2022

(30) Foreign Application Priority Data

Jan. 14, 2021 (JP) ................................. 2021-004549

(51) Int. Cl.
*H02J 7/00* (2006.01)
*B60L 58/12* (2019.01)
*H04L 67/12* (2022.01)

(52) U.S. Cl.
CPC ............ *B60L 58/12* (2019.02); *H02J 7/0049* (2020.01); *B60L 2240/545* (2013.01); *H04L 67/12* (2013.01)

(58) Field of Classification Search
USPC .................................................. 320/134, 132
See application file for complete search history.

(56) References Cited

U.S. PATENT DOCUMENTS

| | | | |
|---|---|---|---|
| 2014/0149058 A1* | 5/2014 | Moh .................. | G01R 31/3828 702/63 |
| 2014/0177145 A1* | 6/2014 | Kawahara ........... | H01M 10/482 361/679.01 |
| 2015/0120225 A1* | 4/2015 | Kim ..................... | G01R 31/392 702/63 |
| 2016/0131720 A1* | 5/2016 | Baba .................... | G01R 31/367 702/63 |

FOREIGN PATENT DOCUMENTS

| | | |
|---|---|---|
| JP | 2012-185124 A | 9/2012 |
| JP | 2014-163680 A | 9/2014 |

* cited by examiner

*Primary Examiner* — Samuel Berhanu
(74) *Attorney, Agent, or Firm* — Oblon, McClelland, Maier & Neustadt, L.L.P.

(57) ABSTRACT

A battery control system includes an acquisition unit configured to acquire a state quantity of the battery, a first estimation unit configured to perform an estimation process of estimating a full charging capacity of the battery based on the state quantity of the battery acquired by the acquisition unit by controlling charging or discharging of the battery, a first transmission unit configured to transmit a transmission request for requesting transmission of an estimation result of the full charging capacity of the battery to a management device when the estimation process is not able to be performed by the first estimation unit, and a first reception unit configured to receive an estimation result of the full charging capacity of the battery from the management device when the estimation process is not able to be performed by the first estimation unit.

11 Claims, 17 Drawing Sheets

FIG. 5A

| NUMBER | OPERATING TIME t_o [h] | FULL CHARGING CAPACITY F_o [Ah] |
|---|---|---|
| 1 | X1 | Y1 |
| 2 | X2 | Y2 |
| ... | ... | ... |

FIG. 5B

| CLASSIFICATION OF OPERATING TIME t_o [h] | FULL CHARGING CAPACITY F_e [Ah] |
|---|---|
| LARGE | Z1 |
| MIDDLE | Z2 |
| SMALL | Z3 |

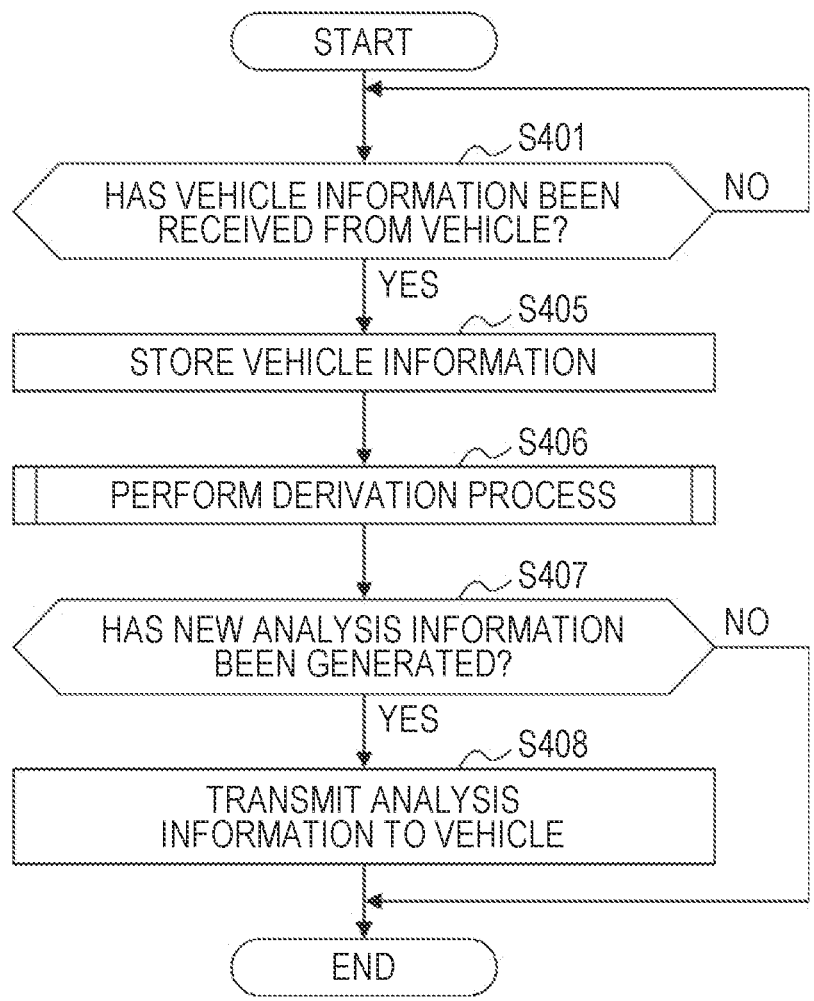

BATTERY CONTROL SYSTEM, BATTERY CONTROL METHOD, BATTERY CONTROL PROGRAM, AND VEHICLE

CROSS-REFERENCE TO RELATED APPLICATION

This application claims priority to Japanese Patent Application No. 2021-004549 filed on Jan. 14, 2021, incorporated herein by reference in its entirety.

BACKGROUND

1. Technical Field

The present disclosure relates to a battery control system, a battery control method, a battery control program, and a vehicle.

2. Description of Related Art

When charging and discharging of a battery are repeatedly performed, a full charging capacity of the battery decreases gradually and the battery deteriorates. Since deterioration of a battery affects a system using the battery, a full charging capacity of the battery needs to be appropriately managed.

Japanese Unexamined Patent Application Publication No. 2012-185124 (JP 2012-185124 A) discloses a method of estimating a full charging capacity using an integrated current value which is obtained by integrating an input current and an output current of a battery. In the estimation method disclosed in JP 2012-185124 A, charging or discharging of the battery is performed in a predetermined range of state of charge (hereinafter referred to as SOC), the integrated current value in the meantime is calculated, and an estimated value of the full charging capacity is calculated by dividing the calculated integrated current value by an SOC difference before and after the charging or discharging.

SUMMARY

However, in the method of estimating a full charging capacity described in JP 2012-185124 A, it is necessary to accurately measure a current which is input to or output from the battery and a charging or discharging environment in which the input or output current is stable is needed. For example, when supply of electric power from the battery to an onboard device is being performed, charging or discharging for estimating the full charging capacity cannot be performed. Accordingly, the full charging capacity cannot be estimated unless there is an opportunity not to perform supply of electric power from the battery to an onboard device The present disclosure provides a battery control system, a battery control method, and a battery control program that can estimate a full charging capacity of a battery even when there is no opportunity for charging or discharging of the battery.

According to a first aspect of the present disclosure, there is provided a battery control system including a vehicle that includes a battery and a management device that is able to communicate with the vehicle. The vehicle includes an acquisition unit configured to acquire a state quantity of the battery, a first estimation unit configured to perform an estimation process of estimating a full charging capacity of the battery based on the state quantity of the battery acquired by the acquisition unit by controlling charging or discharging of the battery, a first transmission unit configured to transmit a transmission request for requesting transmission of an estimation result of the full charging capacity of the battery to the management device when the estimation process is not able to be performed by the first estimation unit, and a first reception unit configured to receive an estimation result of the full charging capacity of the battery from the management device. The management device includes a second reception unit configured to receive the transmission request from the vehicle, a second estimation unit configured to estimate the full charging capacity of the battery when the transmission request has been received by the second reception unit, and a second transmission unit configured to transmit the full charging capacity of the battery estimated by the second estimation unit to the vehicle.

With the battery control system according to this aspect, the estimation process of estimating the full charging capacity of the battery by controlling charging or discharging of the battery is performed in the vehicle, and an estimation result of the full charging capacity of the battery can be acquired from the management device when the estimation process of estimating the full charging capacity of the battery is not able to be performed. Accordingly, even when the estimation process of estimating the full charging capacity of the battery is not able to be performed, it is possible to acquire a new estimation result of the full charging capacity.

A second aspect of the present disclosure provides the battery control system according to the first aspect, wherein the first transmission unit is configured to transmit the transmission request and the state quantity of the battery acquired by the acquisition unit to the management device when the estimation process is not able to be performed by the first estimation unit, the second reception unit is configured to receive the transmission request and the state quantity of the battery from the vehicle, and the second estimation unit is configured to estimate the full charging capacity of the battery based on the received state quantity of the battery when the transmission request has been received by the second reception unit.

With the battery control system according to this aspect, when the estimation process of estimating the full charging capacity of the battery is not able to be performed in the vehicle, the vehicle transmits the acquired state quantity of the battery along with the transmission request to the management device. The management device can estimate the full charging capacity of the battery based on the state quantity of the battery. Accordingly, the management device can accurately estimate the full charging capacity of the battery in consideration of a battery state even when the state quantity of the battery is not acquired.

A third aspect of the present disclosure provides the battery control system according to the first or second aspect, wherein the first transmission unit is configured to transmit the state quantity of the battery acquired by the acquisition unit and the first estimation result of the full charging capacity of the battery estimated by the first estimation unit to the management device when the estimation process has been performed by the first estimation unit.

With the battery control system according to this aspect, the management device can acquire the first estimation result which is a performance result of the estimation process of estimating the full charging capacity of the battery in the vehicle. Accordingly, since the estimation result of the full charging capacity of the battery in an actual operation environment of the battery can be acquired, the management device can collect more accurate estimation results of the full charging capacity of the battery than the estimation result of the full charging capacity based on a test of the battery.

A fourth aspect of the present disclosure provides the battery control system according to the third aspect, wherein the management device further includes a derivation unit configured to classify the state quantity of the battery and the first estimation result in a plurality of vehicles received by the second reception unit according to the state quantity of the battery and to derive a correlation between the classified state quantity of the battery and the full charging capacity of the battery, and the second estimation unit is configured to estimate the full charging capacity of the battery based on the received state quantity of the battery and the correlation derived by the derivation unit when the transmission request has been received by the second reception unit.

With the battery control system according to this aspect, the state quantities of the batteries and the first estimation results in a plurality of vehicles are classified according to the state quantities of the batteries and the correlation between the classified state quantities of the batteries and the full charging capacities of the batteries is derived. Accordingly, when the estimation process of estimating the full charging capacity of the battery in a vehicle is not able to be performed, the full charging capacity of the battery can be estimated using the first estimation results of the full charging capacities of the batteries estimated in other vehicles.

A fifth aspect of the present disclosure provides the battery control system according to the fourth aspect, wherein the vehicle further includes a conversion unit configured to convert a history of a temperature of the battery acquired by the acquisition unit to an operating time when the battery is used at a predetermined representative temperature, the first transmission unit is configured to transmit the operating time converted by the conversion unit as the state quantity of the battery to the management device, the second reception unit is configured to receive the operating time from the vehicle, and the derivation unit is configured to derive a correlation between the operating time and the full charging capacity of the battery as the correlation.

With the battery control system according to this aspect, the management device can arrange the full charging capacity of the battery in the vehicle according to the received operating time at the representative temperature. Accordingly, the management device can estimate the full charging capacity of the battery in consideration of a variation in the temperature of the battery depending on an operation environment of the vehicle or the battery. Since the history of the temperature of the battery in the vehicle is converted to the operating time at the representative temperature, it is possible to decrease an amount of information to be transmitted to the management device in comparison with the history of the temperature.

A sixth aspect of the present disclosure provides the battery control system according to the fourth aspect, wherein the first transmission unit is configured to transmit a history of a temperature of the battery acquired by the acquisition unit as the state quantity of the battery to the management device, the second reception unit is configured to receive the history of the temperature of the battery from the vehicle, the management device further includes a conversion unit configured to convert the history of the temperature of the battery received by the second reception unit to an operating time when the battery is used at a predetermined representative temperature, and the derivation unit is configured to derive a correlation between the operating time and the full charging capacity of the battery as the correlation.

In the battery control system according to this aspect, unlike the fifth aspect, the conversion unit is provided in the management device. Accordingly, since the conversion process of converting the history of the temperature of the battery in the vehicle to the operating time at the representative temperature does not need to be performed, it is possible to decrease a processing cost in the vehicle.

A seventh aspect of the present disclosure provides the battery control system according to any one of the first to sixth aspects, wherein the first estimation unit is configured to control charging or discharging of the battery when a first condition of the vehicle has been satisfied, and the first transmission unit is configured to determine that the estimation process is not able to be performed by the first estimation unit and to transmit the transmission request to the management device when a second condition of the vehicle has not been satisfied while the first estimation unit is controlling charging or discharging of the battery.

With the battery control system according to this aspect, even when the second condition for controlling charging or discharging of the battery is not satisfied while charging or discharging of the battery is being performed in performing the estimation process of estimating the full charging capacity of the battery in the vehicle, it is possible to acquire the estimation result of the full charging capacity of the battery from the management device.

According to an eighth aspect of the present disclosure, there is provided a battery control method that is performed by a vehicle that includes a battery and a management device that is able to communicate with the vehicle, wherein the vehicle performs: acquiring a state quantity of the battery; performing an estimation process of estimating a full charging capacity of the battery based on the acquired state quantity of the battery by controlling charging or discharging of the battery; transmitting a transmission request for requesting transmission of an estimation result of the full charging capacity of the battery to the management device when the estimation process is not able to be performed; and receiving an estimation result of the full charging capacity of the battery from the management device, and the management device performs: receiving the transmission request from the vehicle; estimating the full charging capacity of the battery when the transmission request has been received; and transmitting the estimation result of the full charging capacity of the battery to the vehicle.

With the battery control method according to this aspect, the full charging capacity of the battery is estimated in the vehicle by controlling charging or discharging of the battery, and the vehicle can receive an estimation result of the full charging capacity of the battery from the management device when the estimation process of estimating the full charging capacity of the battery is not able to be performed. Accordingly, even when the estimation process of estimating the full charging capacity of the battery is not able to be performed, it is possible to acquire a new estimation result of the full charging capacity.

According to a ninth aspect of the present disclosure, there is provided a battery control program that is used for a battery control system including a vehicle that includes a battery and a management device that is able to communicate with the vehicle, the battery control program causing the vehicle to perform: acquiring a state quantity of the battery; performing an estimation process of estimating a full charging capacity of the battery based on the acquired state quantity of the battery by controlling charging or discharging of the battery; transmitting a transmission request for requesting transmission of an estimation result of the full charging capacity of the battery to the management device when the estimation process is not able to be performed; and receiving an estimation result of the full charging capacity of the battery from the management device, and the battery control program causing the management device to perform: receiving the transmission request from the vehicle; estimating the full charging capacity of the battery when the transmission request has been received; and transmitting the estimation result of the full charging capacity of the battery to the vehicle.

With the battery control program according to this aspect, the full charging capacity of the battery is estimated in the vehicle by controlling charging or discharging of the battery, and the vehicle can receive an estimation result of the full charging capacity of the battery from the management device when the estimation process of estimating the full charging capacity of the battery is not able to be performed. Accordingly, even when the estimation process of estimating the full charging capacity of the battery is not able to be performed, it is possible to acquire a new estimation result of the full charging capacity.

According to a tenth aspect of the present disclosure, there is provided a vehicle including a battery and being able to communicate with an external management device, the vehicle including: an acquisition unit configured to acquire a state quantity of the battery; a first estimation unit configured to perform an estimation process of estimating a full charging capacity of the battery based on the state quantity of the battery acquired by the acquisition unit by controlling charging or discharging of the battery; a first transmission unit configured to transmit a transmission request for requesting transmission of an estimation result of the full charging capacity of the battery to the management device when the estimation process is not able to be performed by the first estimation unit; and a first reception unit configured to receive an estimation result of the full charging capacity of the battery from the management device.

With the vehicle according to this aspect, the estimation process of estimating the full charging capacity of the battery by controlling charging or discharging of the battery is performed in the vehicle, and an estimation result of the full charging capacity of the battery can be acquired from the management device when the estimation process of estimating the full charging capacity of the battery is not able to be performed. Accordingly, even when the estimation process of estimating the full charging capacity of the battery is not able to be performed, it is possible to acquire a new estimation result of the full charging capacity.

According to an eleventh aspect of the present disclosure, there is provided a battery control system including: a vehicle that includes a battery and a management device that is able to communicate with the vehicle. The vehicle includes: an acquisition unit configured to acquire a state quantity of the battery; a first estimation unit configured to perform an estimation process of estimating a full charging capacity of the battery based on the state quantity of the battery acquired by the acquisition unit by controlling charging or discharging of the battery; a first transmission unit configured to transmit the state quantity of the battery acquired by the acquisition unit and a first estimation result of the full charging capacity of the battery estimated by the first estimation unit to the management device when the estimation process is able to be performed by the first estimation unit; a first reception unit configured to receive a correlation between the state quantity of the battery and the full charging capacity of the battery from the management device; and a second estimation unit configured to estimate the full charging capacity of the battery based on the state quantity of the battery and the correlation received by the first reception unit when the estimation process is not able to be performed by the first estimation unit. The management device includes: a second reception unit configured to receive the state quantity of the battery and the first estimation result estimated by the first estimation unit from the vehicle; a derivation unit configured to derive the correlation based on the state of the battery and the first estimation result received by the second reception unit; and a second transmission unit configured to transmit the correlation derived by the derivation unit to the vehicle.

With the battery control system according to this aspect, the estimation process of estimating the full charging capacity of the battery by controlling charging or discharging of the battery is performed in the vehicle, and the full charging capacity of the battery can be estimated based on the correlation derived by the management device when the estimation process of estimating the full charging capacity of the battery is not able to be performed. Accordingly, even when the estimation process of estimating the full charging capacity of the battery is not able to be performed, it is possible to acquire a new estimation result of the full charging capacity.

As described above, with the battery control system, the battery control device, the battery control method, and the battery control program according to the present disclosure, it is possible to estimate a full charging capacity of a battery and to appropriately control the battery even when there is no opportunity for charging or discharging of the battery.

BRIEF DESCRIPTION OF THE DRAWINGS

Features, advantages, and technical and industrial significance of exemplary embodiments of the present disclosure will be described below with reference to the accompanying drawings, in which like signs denote like elements, and wherein:

FIG. 5A is a diagram illustrating a data structure of collection information in a storage unit according to the first embodiment;

FIG. 5B is a diagram illustrating a data structure of analysis information in a storage unit according to the first embodiment;

FIG. 17 is a flowchart illustrating a process which is performed by the center server according to the third embodiment.

DETAILED DESCRIPTION OF EMBODIMENTS

Hereinafter, specific embodiments of the present disclosure will be described with reference to the accompanying drawings. A battery control system according to the embodiments can be applied as a battery control system including a vehicle with a battery such as an electric vehicle, a hybrid vehicle, or an engine vehicle. Physical arrangement of constituents, functional arrangement of control, and the like described in the embodiments are not intended to limit the technical scope of the present disclosure thereto unless otherwise mentioned.

First Embodiment

Figure 1:
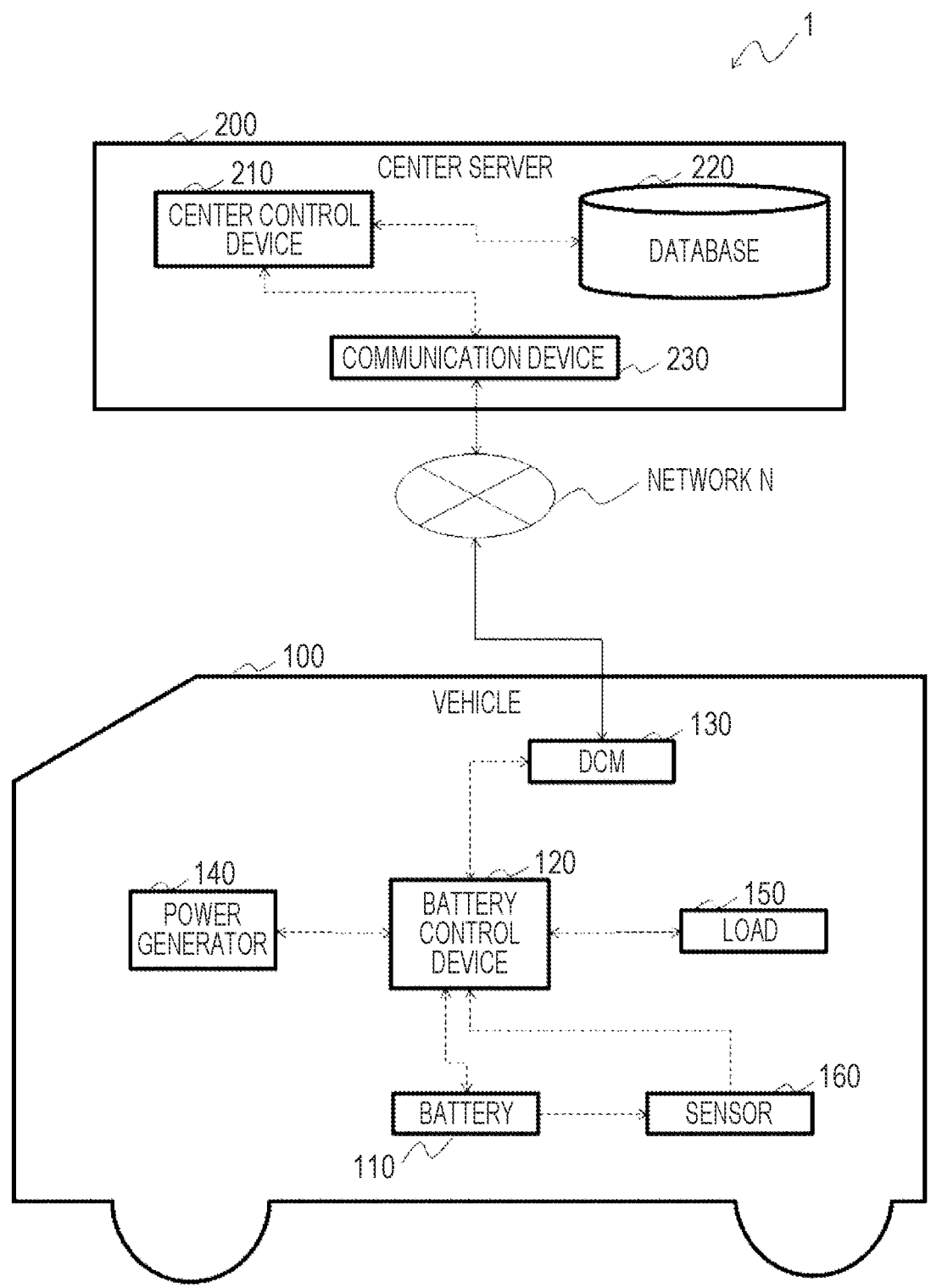
FIG. 1 is a block diagram illustrating a hardware configuration of a battery control system according to a first embodiment.

FIG. 1 is a block diagram illustrating a hardware configuration of a battery control system according to a first embodiment. The battery control system includes a hybrid vehicle 100 (hereinafter referred to as a vehicle 100) and a center server 200 that can communicate with the vehicle 100 via a network N. Only one vehicle 100 is illustrated in FIG. 1, but the center server 200 can communicate with a plurality of vehicles 100.

The device configuration of the vehicle 100 will be described below with reference to FIG. 1. The vehicle 100 includes a DCM 130, a battery 110, a sensor 160, a battery control device 120, a power generator 140, and a load 150.

The DCM 130 is a communication interface that performs data communication with the center server 200 which will be described later. The DCM 130 serves as a transmission unit (a first transmission unit) that transmits information to the center server 200 and a reception unit (a first reception unit) that receives information from the center server 200.

The battery 110 is a high-voltage battery for driving which is chargeable and dischargeable and is, for example, a lithium-ion battery. The battery 110 is supplied with electric power from a power generator 140 such as a motor generator. The battery 110 may be configured to be supplied with electric power from an external charger. The battery 110 supplies electric power to the load 150 including a drive device such as a drive motor. The sensor 160 measures a current and a temperature of the battery 110.

The battery control device 120 is configured to control charging of the battery 110 by the power generator 140 or the like or discharging of the battery 110 to the load 150. The battery control device 120 acquires a current and a temperature acquired by the sensor 160. The battery control device 120 includes a readable storage medium such as a RAM, and can store the current or the temperature acquired from the sensor 160 or various types of information received from the center server 200.

The battery control device 120 is a microcomputer including a CPU, a ROM, and a RAM. The battery control device 120 is communicatively connected to another device via a communication line and is configured to transmit and receive information to and from, for example, a shift lever or a display device which is not illustrated.

The battery control device 120 performs a first estimation process of estimating a full charging capacity of the battery 110 by controlling charging/discharging of the battery 110 and a conversion process of converting the temperature acquired by the sensor 160 to an operating time by causing the CPU to execute a program stored in the ROM.

Figure 2:
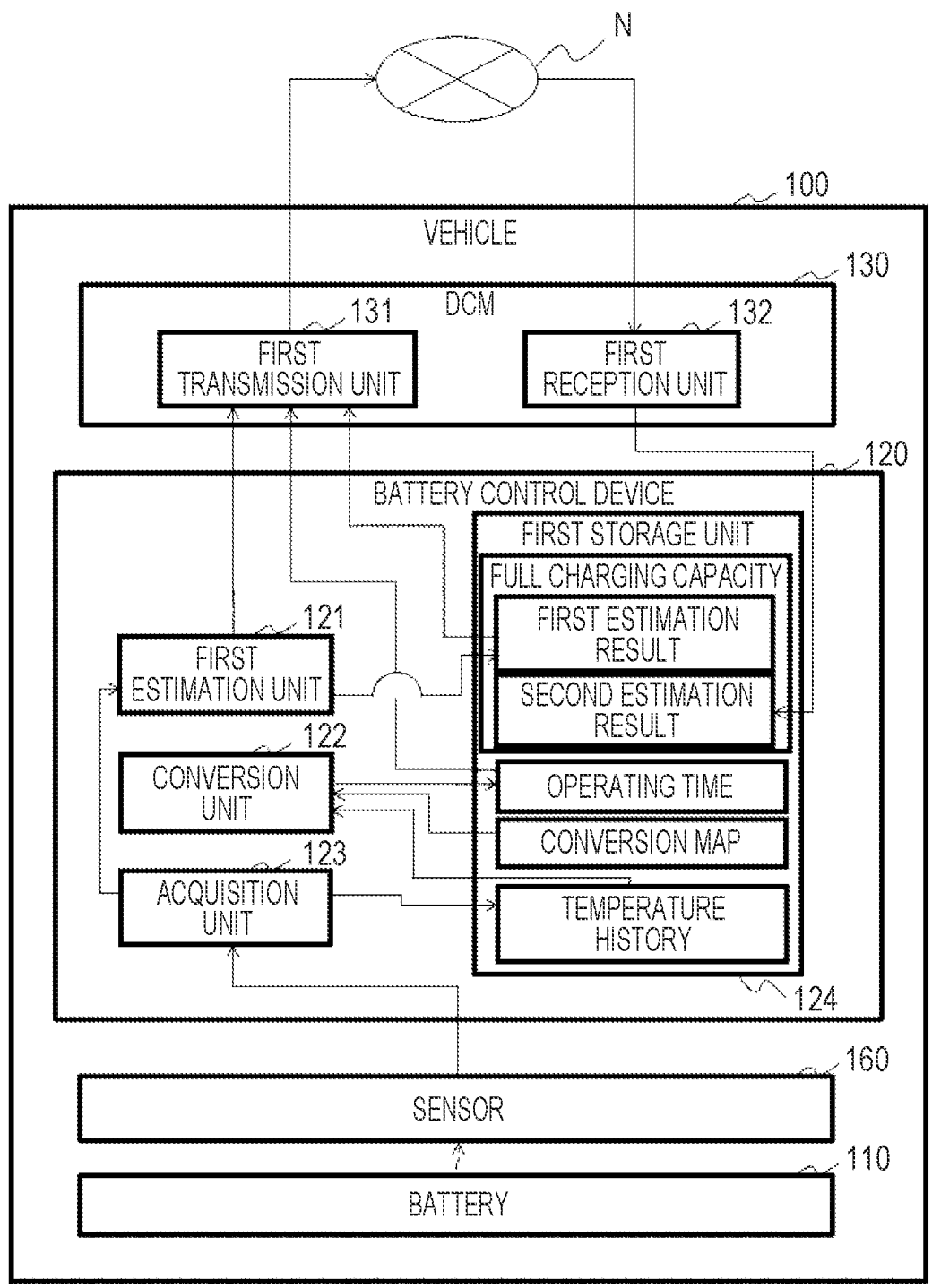
FIG. 2 is a block diagram illustrating a functional configuration of a vehicle according to the first embodiment.

The functional configuration of the vehicle 100 according to this embodiment will be described below with reference to FIG. 2 which is a block diagram illustrating the functional configuration of the vehicle 100 according to this embodiment. With the aforementioned hardware configuration, the vehicle 100 realizes functions of an acquisition unit 123, a first estimation unit 121, a first storage unit 124, a conversion unit 122, a first transmission unit 131, and a first reception unit 132.

The acquisition unit 123 acquires measured values of the current and the temperature from the sensor 160. The acquired measured value of the current is output to the first estimation unit 121 and is used to estimate the full charging capacity in the first estimation process. The acquired measured value of the temperature is stored in the first storage unit 124.

The first estimation unit 121 performs a first estimation process of estimating the full charging capacity of the battery 110 by controlling charging or discharging of the battery 110. The first estimation process is tried at intervals of a predetermined period and is started by the first estimation unit 121 when a predetermined condition has been satisfied. The predetermined period is, for example, two months. The predetermined condition is a case in which stable charging or discharging with an input/output current is possible and is an environment in which electric power may not be supplied from the battery 110 to the load 150. In the driving battery of the hybrid vehicle 100, charging of the battery 110 with regenerative electric power from the power generator 140 or discharging of the battery 110 to the load 150 such as a drive device is performed at the time of traveling. Accordingly, it is thought that stable charging or discharging of the battery 110 is possible when the vehicle 100 is stopped. For example, the predetermined condition is a state in which a shift lever of the vehicle 100 is set to a parking range.

The first estimation unit 121 performs charging/discharging control for charging or discharging the battery 110 in a predetermined SOC range in the first estimation process. For example, the first estimation unit 121 discharges the battery 110 from a first value of SOC to a second value of SOC. The first value and the second value are values within the SOC range in which the battery is to be controlled, and the first value is larger than the second value. When the vehicle 100 is connected to an external charger and charging of the battery 110 is possible, the battery 110 may be charged from the second value of SOC to the first value of SOC.

The first estimation unit 121 acquires an integrated current value by integrating a current value of the battery 110 acquired from the acquisition unit 123 while charging/discharging control for the battery 110 is being performed in a predetermined SOC range. The first estimation unit 121 estimates a full charging capacity and acquires a first estimation result by dividing the integrated current value by the SOC range in which the battery 110 is charged or discharged through the charging/discharging control. The first estimation result is stored in the first storage unit 124.

The first estimation unit 121 starts charging/discharging of the battery 110 when a predetermined period has elapsed after the full charging capacity was previously estimated and the first condition has been satisfied. The first condition is a state in which the shift lever of the vehicle 100 is set to a parking range. When the first condition has not been satisfied even with the elapse of the predetermined period and charging/discharging control of the battery 110 could not be started in a predetermined time, the first estimation unit 121 determines that the full charging capacity of the battery 110 cannot be estimated.

About 10 minutes is required for the charging/discharging control. Therefore, the first condition may include a condition that a time required for charging-discharging control and a message for ascertaining whether the charging/discharging control is to be performed are displayed on a display device which is not illustrated and performing of the charging/discharging control is permitted by an occupant in addition to the aforementioned condition. Accordingly, it is possible to acquire permission for performing the charging/discharging control from an occupant by informing the occupant that a stopped state of 10 minutes is necessary before the charging/discharging control is performed.

The first estimation unit 121 stops the charging/discharging control when a second condition has not been satisfied after the charging/discharging control has been started. Accordingly, the first estimation unit determines that the full charging capacity of the battery 110 could not be estimated. The second condition is a state in which the shift lever of the vehicle 100 is set to the parking range.

Figure 3A:
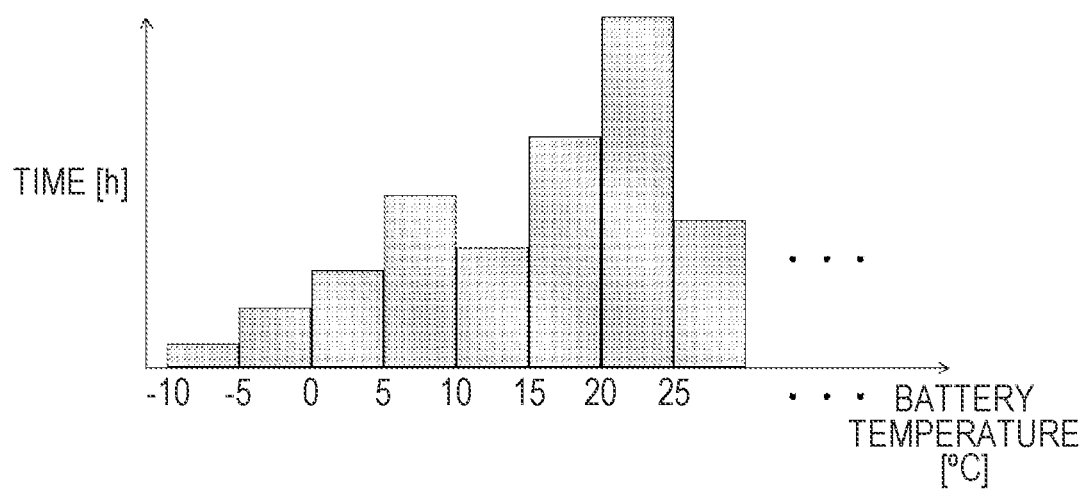
FIG. 3A is a diagram illustrating a data structure of the temperature history for illustrating handling of a temperature history of the vehicle according to the first embodiment.

The first storage unit 124 stores the measured value of the temperature acquired by the acquisition unit 123 as a temperature history including time information. For example, as illustrated in FIG. 3A, a cumulative time for each of temperatures which are divided into a plurality of sections is stored. The plurality of sections is, for example, sections which are divided every five degrees. For example, when the measured value of the temperature is 22 degrees in a period of time from time t1 to time t2, a median value thereof is 20 degrees and a time of t2-t1 is added to a section equal to or greater than 17.5 degrees and less than 22.5 degrees. Time information may be acquired by a timer which is not illustrated or may be calculated from a predetermined acquisition cycle of the temperature in the acquisition unit 123. The cumulative time at a temperature of each section is exemplified as a data structure in the storage unit, but the data structure is not limited thereto as long as a time for which the battery 110 is in a certain temperature environment is stored.

The conversion unit 122 performs a conversion process of converting the temperature history stored in the storage unit to the operating time of the battery 110 at a representative temperature. A rate of decrease of a capacity $L_f$ [%] due to aging of the battery 110 depends on a deterioration factor $K_f$ [-] and an elapsed time. Here, the deterioration factor $K_f$ is calculated by Expression 1 which is an Arrhenius's equation.

$$K_f = A\ \exp\left(-\frac{E_a}{RT}\right) \quad \text{Expression 1}$$

Figure 3B:
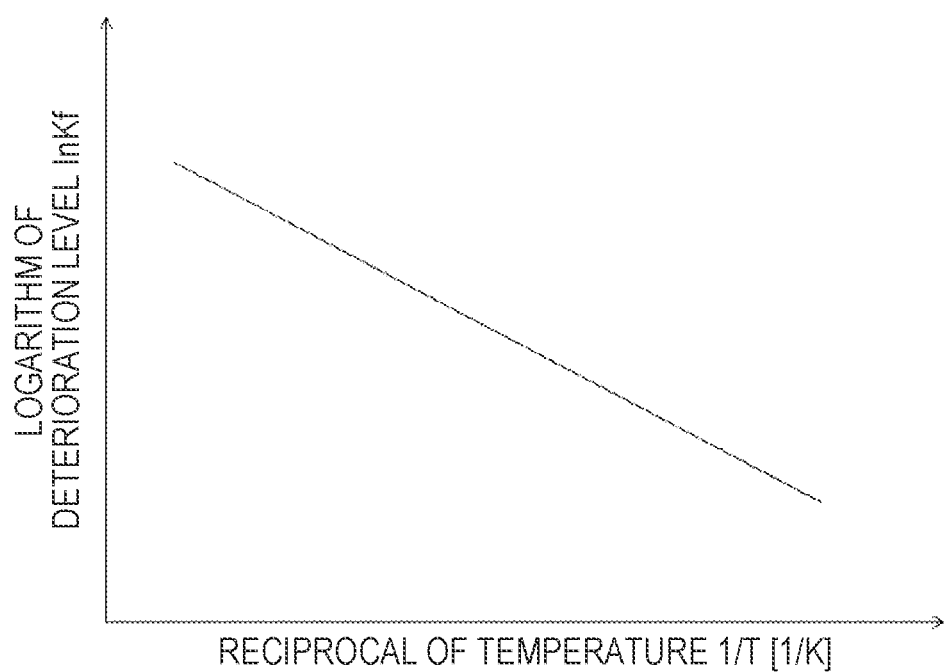
FIG. 3B is a graph illustrating a relationship between a temperature and a deterioration level for illustrating handling of a temperature history of the vehicle according to the first embodiment.

Here, A is a constant, $E_a$ [J/mol] is activation energy, R [J/(K·mol)] is a gas constant, and T is an absolute temperature [K]. That is, the deterioration factor is a function of a temperature, and a deterioration level increases and deterioration progresses more easily as the temperature increases. FIG. 3B is a diagram schematically illustrating a relationship between a logarithm of the deterioration level and a reciprocal of the temperature.

Accordingly, a ratio of the deterioration factor $K_f(T_a)$ at an arbitrary temperature $T_a$ and the deterioration factor $K_f(T_r)$ at a representative temperature $T_r$ is acquired by Expression 2.

$$\frac{K_f(T_a)}{K_f(T_r)} = A\ \exp\left(-\frac{E_a}{R}*\left(\frac{1}{T_r}-\frac{1}{T_a}\right)\right) \quad \text{Expression 2}$$

When the battery 110 is left in an environment of the representative temperature $T_r$, a deterioration time of the same deterioration level as the deterioration level of the battery 110 in a time $t_a$ in the environment of an arbitrary temperature $T_a$ can be calculated by the ratio of the deterioration factors. For example, when a deterioration rate at 60° C. is derived as five times the deterioration rate at a representative temperature 50° C. and a recorded cumulative time at 60° C. is 100 h, the time can be converted to a cumulative time corresponding to 500 hours at 50° C.

A conversion expression for converting the cumulative time at a target temperature to an operating time at the representative temperature $T_r$ is acquired by Expression 3.

$$t_r = \sum_{a=T_{min}}^{T_{max}} \frac{K_f(T_a)}{K_f(T_r)}*t_a \quad \text{Expression 3}$$

In this way, the operating time $t_r$ at the representative temperature $T_r$ is acquired. Since the constant A and the activation energy $E_a$ are uniquely determined by the battery 110, the ratio of the deterioration factors at the temperatures may not be calculated every time but the ratio converted to a constant in advance at the time of design may be stored as a conversion map. In this embodiment, the conversion map is stored in the first storage unit 124.

The conversion process in the conversion unit 122 may be periodically performed or may be performed when the charging/discharging control is performed by the first estimation unit 121 or when information is transmitted from the first transmission unit 131 which will be described later to the center server 200.

The first transmission unit 131 transmits vehicle information to the center server 200 via the DCM 130. Here, the vehicle information is information on the vehicle 100 such as the transmission request, the operating time, and the first estimation result. The full charging capacity of the battery 110 can be estimated by the first estimation unit 121, and the first transmission unit 131 outputs the first estimation result and the operating time to the DCM 130 and transmits the first estimation result and the operating time to the center server 200 via the DCM 130 when the first estimation result is acquired.

When the full charging capacity could not be estimated by the first estimation unit 121, the first transmission unit 131 outputs the transmission request for requesting the center server 200 to transmit an estimation result of the full charging capacity of the battery 110 and the operating time to the DCM 130, and transmits the transmission request and the operating time to the center server 200 via the DCM 130. The transmission request includes identification information for identifying the vehicle 100. The first transmission unit 131 may transmit the transmission request and the operating time at the same time or may transmit the transmission request and the operating time at different timings along with identification information indicating that they are a group of information.

In this embodiment, the first transmission unit 131 may determine that the full charging capacity could not be estimated by the first estimation unit 121 by acquiring information indicating that the full charging capacity could not be estimated from the first estimation unit 121, or may determine that the full charging capacity could not be estimated by the first estimation unit 121 because an estimation result has not been acquired from the first estimation unit 121.

The first reception unit 132 receives a second estimation result of the full charging capacity which is estimated by the center server 200 from the center server 200 via the DCM 130. The second estimation result is stored in the first storage unit 124.

With the aforementioned configuration, the full charging capacity can be acquired based on the first estimation result from the first estimation unit 121 when the full charging capacity could be estimated by the first estimation unit 121 of the battery control device 120, and the second estimation result of the full charging capacity can be acquired from the center server 200 by transmitting the transmission request from the first transmission unit 131 even when the full charging capacity cannot be estimated by the first estimation unit 121. Accordingly, even when the full charging capacity cannot be estimated by the battery control device 120 of the vehicle 100, it is possible to acquire an estimation result of the full charging capacity from the center server 200 and to appropriately update the full charging capacity.

The center server 200 according to this embodiment will be described below. The center server 200 collects vehicle information from a plurality of vehicles 100 and estimates the full charging capacity of the battery 110 of the vehicle 100 based on the collected vehicle information. A hardware configuration of the center server 200 will be described below with reference to FIG. 1. The center server 200 includes a communication device 230, a database 220, and a center control device 210. The center server 200 may be configured as a single device or may be configured as a combination of a plurality of devices.

The communication device 230 receives vehicle information from a plurality of vehicles and transmits the received vehicle information to the center control device 210. The communication device 230 receives a transmission request which is a request for estimating the full charging capacity of the battery 110 from a vehicle 100 and transmits the second estimation result of the full charging capacity to the vehicle 100 in response to the transmission request.

The database 220 stores vehicle information collected from a plurality of vehicles 100. The vehicle information stored in the database 220 includes the operating time at a representative temperature and the full charging capacity.

The center control device 210 is a microcomputer including a CPU, a ROM, and a RAM. By causing the CPU to execute a program stored in the ROM, the center control device 210 performs a derivation process of deriving a correlation between the operating time and the full charging capacity stored in the database 220 and a second estimation process of estimating the full charging capacity when a transmission request has been received from the vehicle 100 via the communication device 230.

Figure 4:
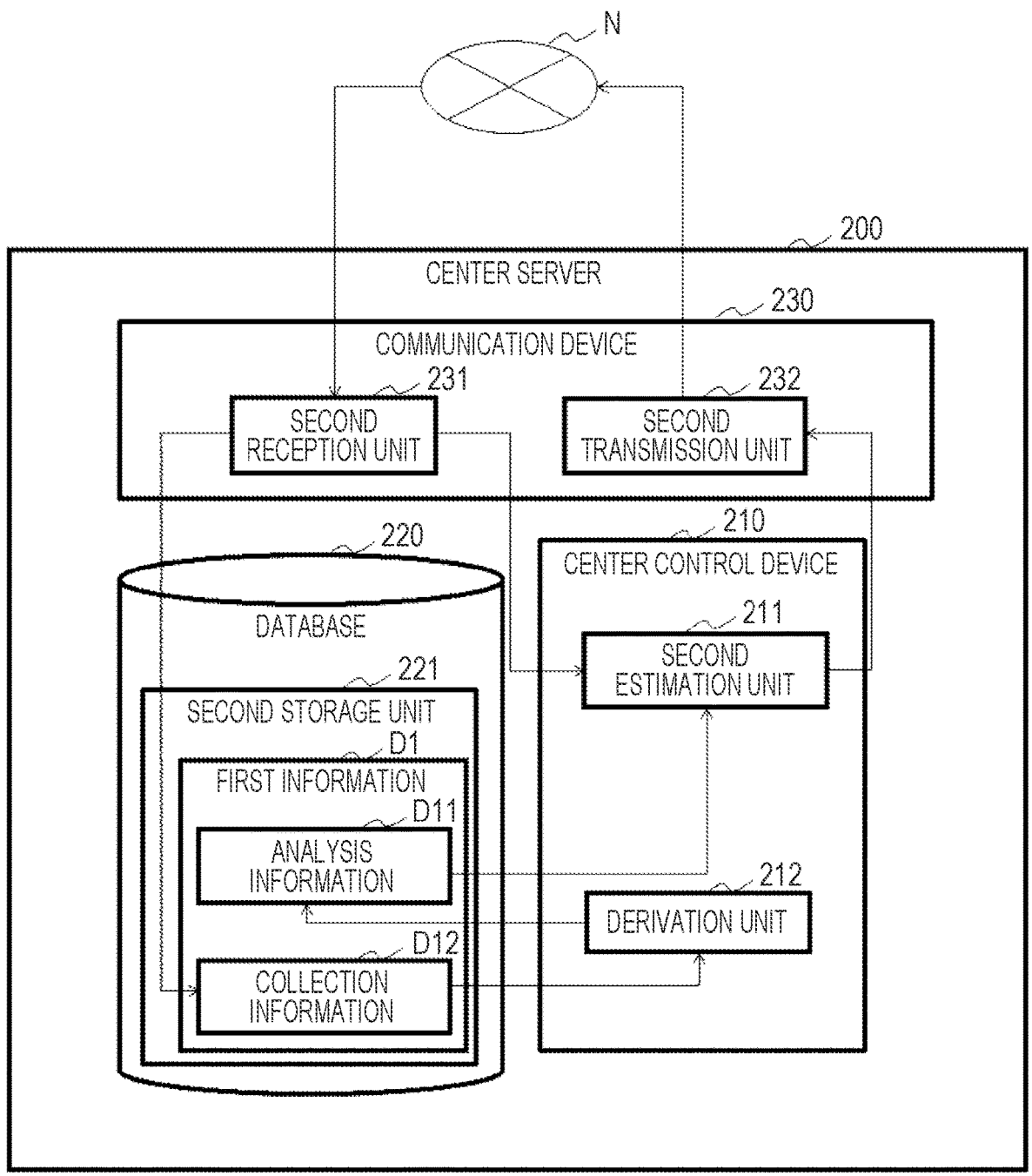
FIG. 4 is a block diagram illustrating a functional configuration of a center server according to the first embodiment.

A functional configuration of the center server 200 according to this embodiment will be described below with reference to FIG. 4 which is a block diagram illustrating the functional configuration of the center server 200 according to this embodiment. The center server 200 realizes functions of a second reception unit 231, a second transmission unit 232, a second estimation unit 211, a derivation unit 212, and a second storage unit 221 using the aforementioned hardware configuration.

The second reception unit 231 and the second transmission unit 232 are functional units which are realized by the communication device 230. The second reception unit 231 receives the operating time which is vehicle information, the first estimation result of the full charging capacity, and the transmission request from the battery control device 120 of the vehicle 100 via the DCM 130.

The second transmission unit 232 transmits the second estimation result of the full charging capacity estimated by the second estimation unit 211 which will be described later to the vehicle 100 having transmitted the transmission request in response to the transmission request received from the vehicle 100 by the second reception unit 231. The second transmission unit 232 identifies a transmission destination of the second estimation result based on the identification information of the vehicle 100 included in the transmission request received from the second reception unit 231, and transmits the second estimation result to the identified vehicle 100.

The second storage unit 221 is a functional unit which is constituted by the database 220. The second storage unit 221 stores first information D1 based on the first estimation result of the full charging capacity which is estimated by performing charging/discharging control of the battery 110 in a plurality of vehicles 100. FIG. 5 illustrates an example of a data structure of the first information D1.

The first information D1 will be more specifically described below with reference to FIGS. 5A and 5B. The first information D1 includes collection information D12 of the estimation results of the full charging capacities collected from a plurality of vehicles 100 and analysis information D11 which is acquired from the derivation unit 212 by deriving a correlation between the operating time and the full charging capacity based on the collection information D12. When the operating time $t\_o$ [h] at a representative temperature $T_r$ of the battery 110 and the first estimation result $F\_o$ [Ah] of the full charging capacity are acquired from the vehicles 100 by the second reception unit 231, the second storage unit 221 stores the acquired information as the collection information D12. When a correlation between the operating time $t\_o$ and the first estimation result $F\_o$ is derived by the derivation unit 212, the second storage unit 221 stores the acquired correlation as the analysis information D11.

The derivation unit 212 performs a derivation process of deriving the correlation between the operating time t_o and the full charging capacity F_o from the collection information D12 stored in the second storage unit 221. The derivation unit 212 classifies groups of the operating time t_o and the full charging capacity F_o in a plurality of vehicles 100 stored in the second storage unit 221 into a plurality of sections based on the magnitude of the operating time t_o. In this embodiment, the derivation unit 212 classifies the groups of information into three sections, large, middle, and small, according to the magnitude of the operating time t_o. The number of sections is not limited thereto.

The derivation unit 212 selects a minimum value of the classified full charging capacities F_o as a representative value F_e [Ah] of the full charging capacity. In this way, the derivation unit 212 acquires the correlations between the full charging capacity F_o and the representative values F_e in the classifications of the operating time t_o and stores the acquired correlations as analysis information D11 in the second storage unit 221. In FIG. 5B, the groups of information are classified into three sections according to the magnitude of the operating time t_o and the representative value F_e of the full charging capacity F_o in each section is illustrated as an example of the analysis information D11.

The derivation unit 212 performs the aforementioned derivation process when a predetermined number of groups of the collection information D12 which are collected from a plurality of vehicles 100 and which includes the groups of the operating time t_o and the full charging capacity F_o are stored. In addition, when the predetermined number of groups are collected, the derivation unit 212 updates the correlation. The derivation unit 212 compares the derived representative value F_e of the full charging capacity F_o classified into each section with the minimum value of the full charging capacity F_o of each section which has been newly stored and updates the minimum value as a new representative value F_e.

The representative value F_e of the full charging capacity F_o is not limited to the minimum value and an average value of each section may be selected as the representative value. Derivation of the correlation in the derivation unit 212 is not limited to the aforementioned example, and a relational expression may be derived from the groups of the operating time t_o and the full charging capacity F_o. A probability of the correlation derived by the derivation unit 212 may be ascertained based on test data which is acquired in advance.

The second estimation unit 211 performs a second estimation process of estimating the full charging capacity when the transmission request has been received from the vehicle 100 via the communication device 230. When the analysis information D11 which is the correlation derived by the derivation unit 212 is stored in the second storage unit 221, the second estimation unit 211 estimates the full charging capacity of the battery 110 of the vehicle 100 based on the operating time received along with the transmission request from the vehicle 100 by the second reception unit 231 and the correlation stored in the second storage unit 221. When the number of pieces of the collection information D12 from a plurality of vehicles 100 in the second storage unit 221 is not sufficient and the correlation has not been derived, the second estimation unit 211 estimates the full charging capacity of the battery 110 based on the first information D1 stored in the second storage unit 221. The second estimation result of the full charging capacity estimated by the second estimation unit 211 is transmitted to the vehicle 100 by the second transmission unit 232.

Figure 6:
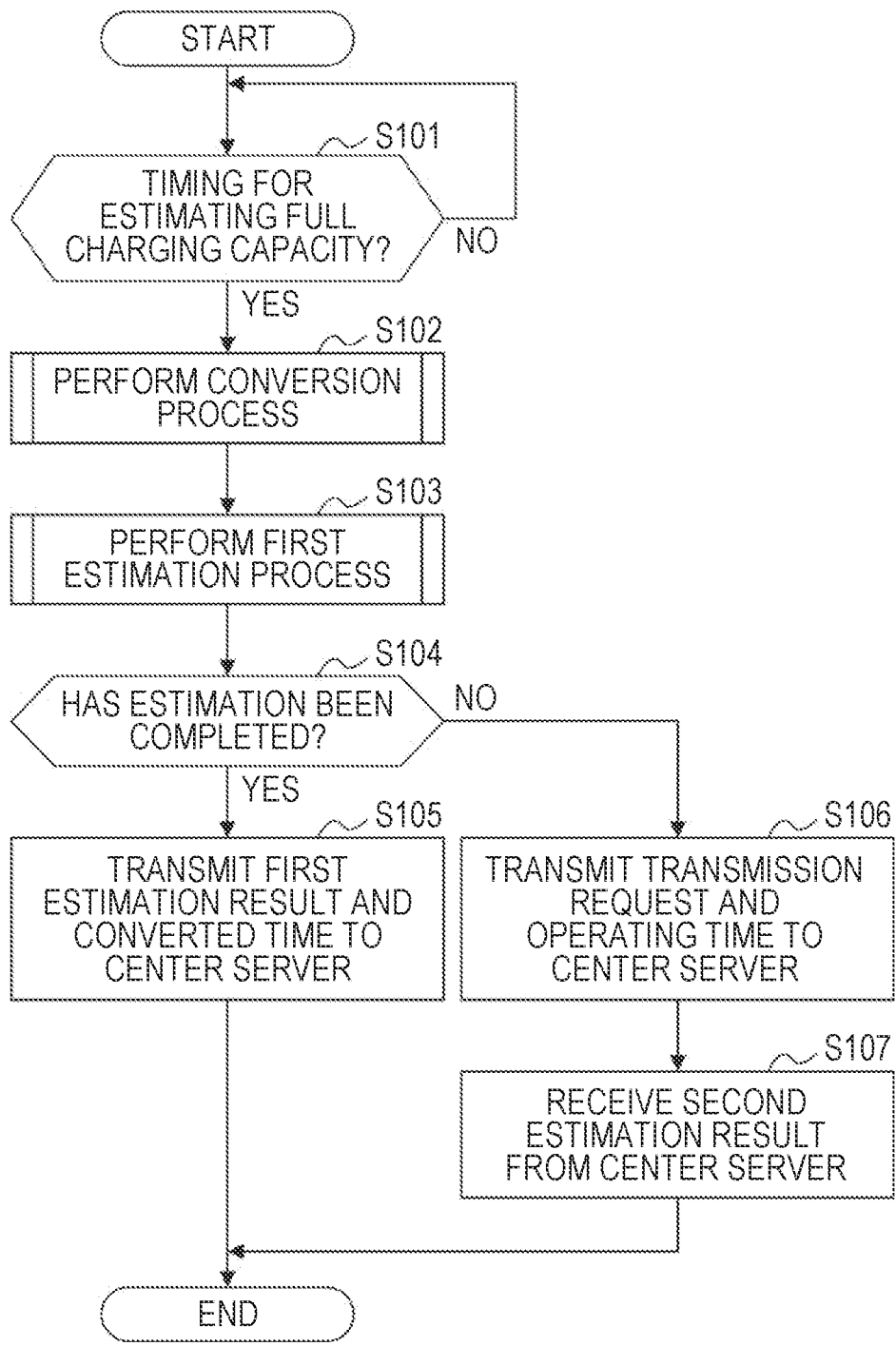
FIG. 6 is a flowchart illustrating a process which is performed in the vehicle according to the first embodiment.

A control flow which is performed by a vehicle 100 according to this embodiment will be described below with reference to FIG. 6. For example, this control flow is started when an 1G state of the vehicle 100 is switched to an ON state.

In Step S101, the first estimation unit 121 ascertains whether it is time to estimate a full charging capacity. For example, when a predetermined period has elapsed after the process of estimating a full charging capacity has been previously performed, the first estimation unit 121 determines that it is time to estimate a full charging capacity, and the control flow proceeds to Step S102. The predetermined period is, for example, two months. When it is determined that it is not time to estimate a full charging capacity, the control flow returns to Step S101.

In Step S102, the conversion unit 122 performs a conversion process. The conversion unit 122 converts a temperature history stored in the first storage unit 124 to the operating time of the battery 110 at a representative temperature. Details of the conversion process will be described later with reference to FIG. 7. After the conversion process has been performed in Step S102, the control flow proceeds to Step S103.

Subsequently, in Step S103, the first estimation unit 121 performs the first estimation process. Details of the first estimation process will be described later with reference to FIG. 8. After the first estimation process has been performed in Step S103, the control flow proceeds to Step S104.

Subsequently, in Step S104, the first transmission unit 131 determines whether the first estimation process performed by the first estimation unit 121 has been completed. For example, when a completion flag acquired from the first estimation unit 121 is set to 1 indicating that the first estimation process has been completed, it is determined that the first estimation process has been completed. Completion of the first estimation process represents that the first estimation unit 121 could acquire the first estimation result of the full charging capacity by performing the first estimation process. When it is determined that the first estimation process has been completed, the control flow proceeds to Step S105. When it is determined that the first estimation process has not been completed, the control flow proceeds to Step S106.

In Step S105, the first transmission unit 131 outputs the first estimation result and the operating time to the DCM 130 and transmits the first estimation result and the operating time to the center server 200 via the DCM 130.

In Step S106, the first transmission unit 131 outputs a transmission request for requesting the center server 200 to transmit an estimation result of the full charging capacity of the battery 110 and the operating time to the DCM 130 and transmits the transmission request and the operating time to the center server 200 via the DCM 130. The first transmission unit 131 may transmit the transmission request and the operating time at the same time or may transmit the transmission request and the operating time at different timings along with identification information indicating that they are information on one group. After Step S106 has been performed, the control flow proceeds to Step S107. In Step S107, the first reception unit 132 receives a second estimation result of the full charging capacity estimated by the center server 200 from the center server 200 via the DCM 130. The control flow ends when Step S105 has been performed or when Step S107 has been performed.

Figure 7:
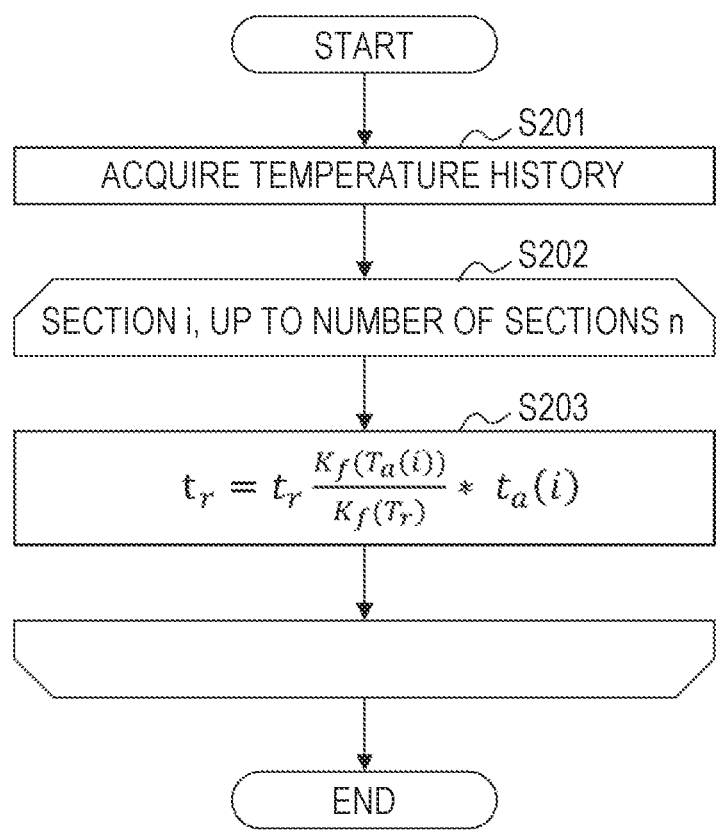
FIG. 7 is a flowchart illustrating a conversion process which is performed by a battery control device according to the first embodiment.

The conversion process which is performed by the battery control device 120 will be described below with reference to FIG. 7. In this embodiment, the conversion process is started when it is determined that it is time for the first estimation unit 121 to estimate the full charging capacity. The conversion process is a process of converting a temperature history stored in the first storage unit 124 to the operating time of the battery 110 at a representative temperature, which is performed by the conversion unit 122.

In Step S201, the conversion unit 122 acquires a temperature history from the first storage unit 124. The temperature history includes a cumulative time $t_a$ for each temperature $T_a$ which is classified into a plurality of sections as described above. Cumulative times $t_1, t_2, \ldots, t_n$ are stored for the temperatures $T_1, T_2, \ldots, T_n$, where n denotes the number of sections. Then, in Step S202, the process of Step S203 is repeatedly performed by the number of sections n. In Step S203, the conversion unit 122 converts the cumulative time at each temperature to the operating time $t_r$ at the representative temperature $T_r$ over the number of sections n and integrates the operating time. In this way, the conversion unit 122 acquires the operating time $t_r$ at the representative temperature $T_r$. After Step S203 has been performed up to the number of sections n, the conversion unit 122 ends the conversion process.

Figure 8:
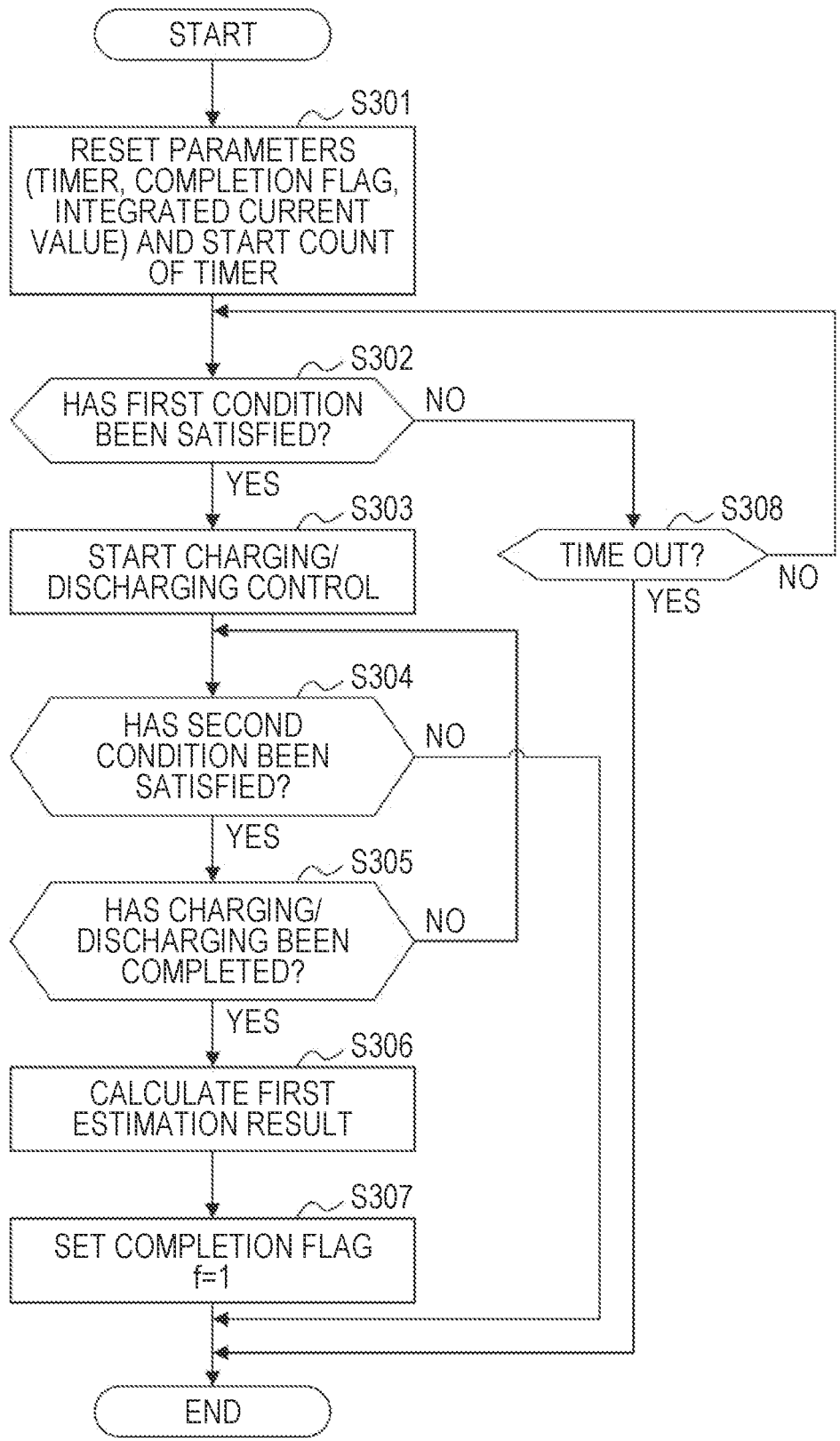
FIG. 8 is a flowchart illustrating a first estimation process which is performed by the battery control device according to the first embodiment.

The first estimation process of estimating the full charging capacity which is performed by the battery control device 120 will be described below with reference to FIG. 8. In Step S301, the first estimation unit 121 resets various parameters. Initial values are substituted into a timer which will be described later, a completion flag, and an integrated current value. The initial values are preferably zero.

In Step S302, the first estimation unit 121 determines whether the first condition has been satisfied. When it is determined that the first condition has been satisfied, the control flow proceeds to Step S303. When it is determined that the first condition has not been satisfied, the control flow proceeds to Step S308.

In Step S303, the first estimation unit 121 starts charging/discharging control of the battery 110. The first estimation unit 121 performs charging/discharging control such that the battery 110 is charged or discharged in a predetermined SOC range. While the battery 110 is being charged or discharged, the acquisition unit 123 acquires a measured value of the current of the battery 110 from the sensor 160. The first estimation unit 121 integrates the acquired measured value of the current.

Subsequently, in Step S304, the first estimation unit 121 determines whether the second condition has been satisfied while the charging/discharging control is being performed. When it is determined that the second condition has been satisfied, the control flow proceeds to Step S305. When it is determined that the second condition has not been satisfied, the charging/discharging control is stopped and the first estimation process ends.

In Step S305, the first estimation unit 121 determines whether the charging/discharging control has been completed. For example, when the battery 110 has been discharged or charged in a preset period of time, the first estimation unit 121 determines that the charging/discharging control has been completed. Alternatively, the sensor 160 measures the voltage of the battery 110 and it is determined that the charging/discharging control has been completed when an SOC estimated based on the voltage of the battery 110 is a lower limit or an upper limit for estimating the full charging capacity. When the first estimation unit 121 determines that the charging/discharging control has been completed, the control flow proceeds to Step S306. When the first estimation unit 121 determines that the charging/discharging control has not been completed, the charging/discharging control is continued and the control flow returns to Step S304.

In Step S306, the first estimation unit 121 acquires the first estimation result of the full charging capacity by dividing the integrated current value by the SOC range in which the battery 110 is charged or discharged by the charging/discharging control. Subsequently, in Step S307, the completion flag is set to 1.

In Step S308, the first estimation unit 121 determines whether the time is over with reference to the timer. When it is determined that the time is over, the first estimation unit 121 ends the first estimation process. When the first estimation unit 121 determines that the time is not over, the control flow returns to Step S302.

This control flow ends when the first estimation unit has been completed, when the first estimation process has been stopped, or when the time is over without satisfying the first condition.

Figure 9:
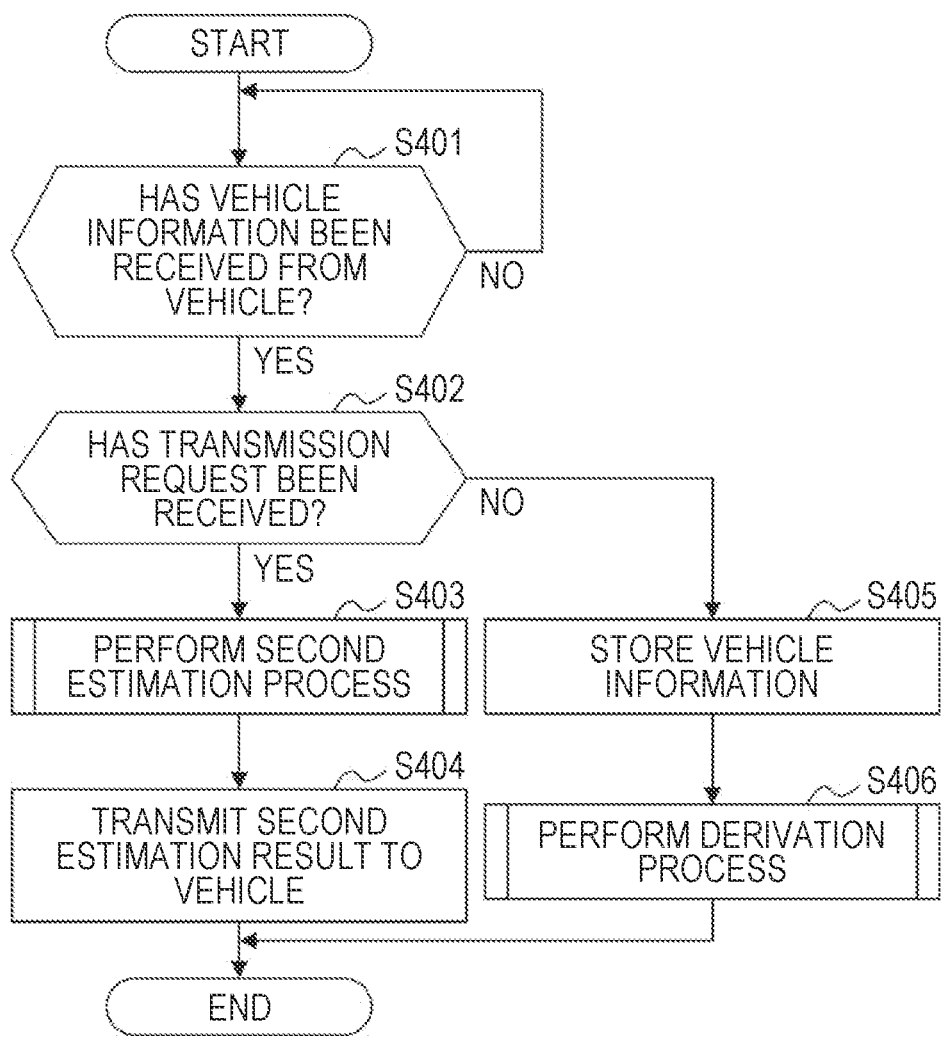
FIG. 9 is a flowchart illustrating a process which is performed by the center server according to the first embodiment.

A control flow which is performed by the center server 200 according to this embodiment will be described below with reference to FIG. 9. In Step S401, it is determined whether the second reception unit 231 has received vehicle information from the vehicle 100. When it is determined in Step S401 that the second reception unit 231 has received vehicle information, the control flow proceeds to Step S402. When it is determined in Step S401 that the second reception unit 231 has not received vehicle information, the control flow returns to Step S401.

In Step S402, the second reception unit 231 determines whether the vehicle information received from a vehicle 100 is a transmission request. In other words, the second reception unit 231 determines whether a transmission request has been received from the vehicle 100. When it is determined in Step S402 that the second reception unit 231 has received the transmission request, the control flow proceeds to Step S403. When it is determined in Step S402 that the transmission request has not been received, the control flow proceeds to Step S405.

In Step S403, the second estimation unit 211 performs the second estimation process of estimating the full charging capacity and acquires the second estimation result. The second estimation process will be described later with reference to FIG. 11. Subsequently, in Step S404, the second transmission unit 232 transmits the second estimation result to the vehicle 100 having transmitted the transmission request to the center server 200.

In Step S405, the second storage unit 221 stores the operating time at the representative temperature of the battery 110 and the first estimation result of the full charging capacity which are received from the vehicle 100 by the second reception unit 231 as collection information D12. Subsequently, in Step S406, the derivation unit 212 performs the derivation process. The derivation process will be described later with reference to FIG. 10.

Figure 10:
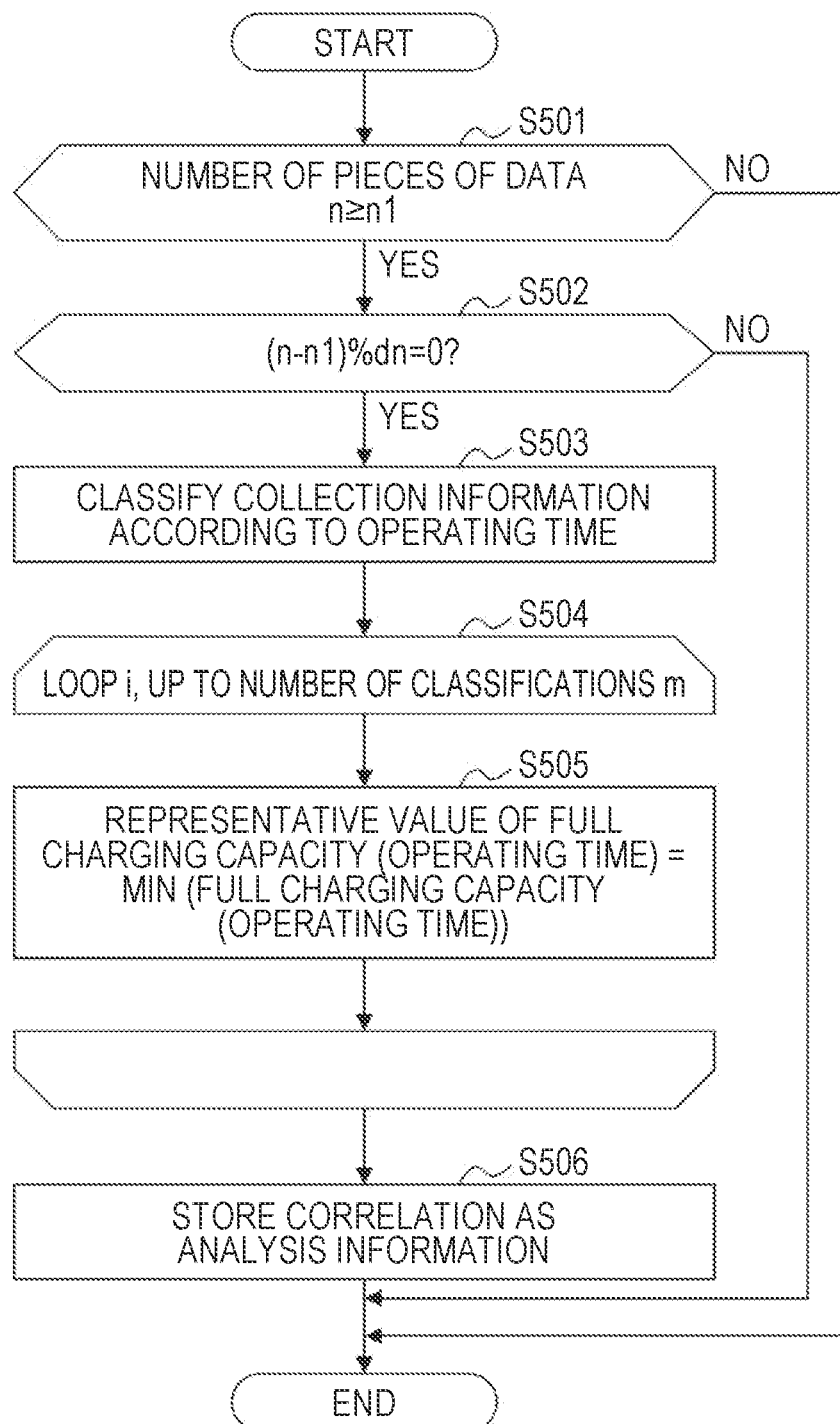
FIG. 10 is a flowchart illustrating a derivation process which is performed by the center server according to the first embodiment.

The derivation process which is performed by the center server 200 will be described below with reference to FIG. 10. In Step S501, the derivation unit 212 determines whether the number of pieces n of the collection information D12 stored in the second storage unit 221 is equal to or greater than a predetermined number n1. When it is determined that the number of pieces of collection information is equal to or greater than the predetermined number n1, the control flow proceeds to Step S502. When it is determined that the number of pieces of collection information is not equal to or greater than the predetermined number n1, the derivation process ends.

In Step S502, the derivation unit 212 determines whether a difference between the number of pieces n of the collection information D12 stored in the second storage unit 221 and the predetermined number n1 is divisible by dn. When the difference is divisible, the control flow proceeds to Step S503. That is, the processes of Step S503 and steps subsequent thereto are performed whenever dn groups of the operating time and the first estimation result of the full charging capacity which is equal to or greater than the predetermined number n1 are stored. Accordingly, derivation of the analysis information D11 which is the correlation between the operating time and the full charging capacity from the first estimation result of the full charging capacity collected from a plurality of vehicles 100 is performed by the derivation unit 212 whenever a predetermined number of pieces of data is stored.

In Step S503, the derivation unit 212 classifies the groups of the operating time and the first estimation result in a plurality of vehicles 100 stored in the second storage unit 221 into a plurality of sections of the operating time. Subsequently, in Step S504, the process of Step S505 is repeatedly performed by the number of sections.

In Step S505, the derivation unit 212 stores a minimum value of the full charging capacity in each section as a representative value of the full charging capacity in the operating time of the corresponding section. When derivation of a representative value in each section was performed in the past, the derivation unit 212 compares the derived representative value of the full charging capacity for each section with a newly stored minimum value of the full charging capacity for each section and updates the minimum value as a new representative value.

Subsequently, in Step S506, the derivation unit 212 stores the correlation which is an estimated value of the full charging capacity in each section as analysis information D11 in the second storage unit 221. In this control flow, the correlation is derived according to the total number of pieces of data, but it may be determined whether to derive the correlation according to the number of pieces of data for each section.

Figure 11:
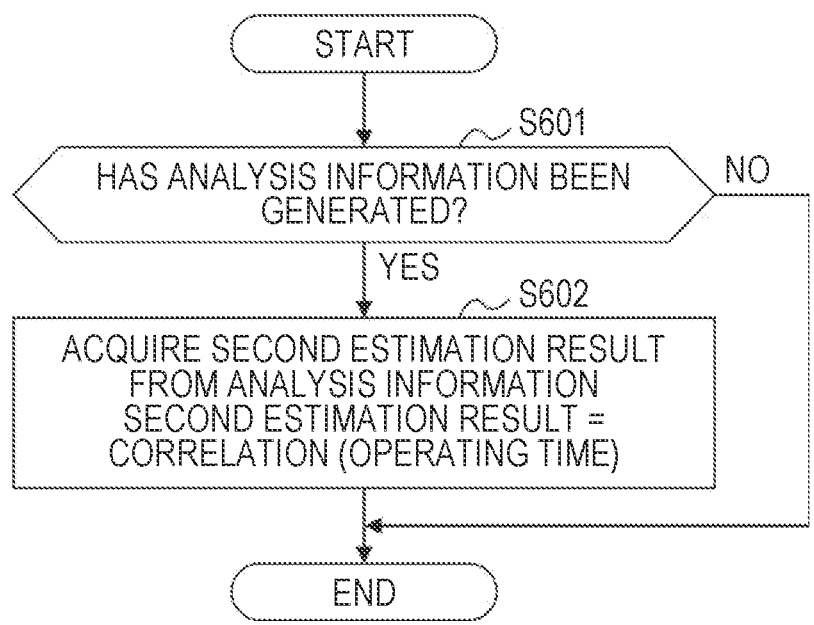
FIG. 11 is a flowchart illustrating a second estimation process which is performed by the center server according to the first embodiment.

The second estimation process of estimating the full charging capacity which is performed by the center server 200 will be described below with reference to FIG. 11. In Step S601, the second estimation unit 211 determines whether the analysis information D11 which is the correlation derived by the derivation unit 212 is stored in the second storage unit 221. When it is determined in Step S601 that the analysis information D11 which is the correlation derived by the derivation unit 212 is stored in the second storage unit 221, the control flow proceeds to Step S602. When it is determined in Step S601 that the analysis information D11 which is the correlation derived by the derivation unit 212 is not stored in the second storage unit 221, the second estimation process ends. That is, when the number of pieces of the collection information D12 from a plurality of vehicles 100 is not sufficient in the second storage unit 221 and the correlation is not derived, the second estimation process ends without estimating the full charging capacity.

In Step S602, the second estimation unit 211 estimates the full charging capacity of the battery 110 of a vehicle 100 based on the operating time received along with the transmission request from the vehicle 100 by the second reception unit 231 and the correlation stored in the storage unit.

In the second estimation process, when the full charging capacity could not be estimated, the center server 200 transmits the second estimation result indicating that the full charging capacity could not be estimated to the vehicle 100. In this case, the vehicle 100 may use a previous estimation result instead of the second estimation result of the full charging capacity. Alternatively, information indicating a relationship between an operating time and a deterioration level which has been acquired by test in advance may be stored in the vehicle 100 and may be alternatively used to estimate the full charging capacity.

Second Embodiment

In the first embodiment, when an amount of estimation results of full charging capacities collected from a plurality of vehicles 100 is insufficient and correlations thereof are not derived, the center server 200 transmits the second estimation result indicating that a full charging capacity could not be estimated to the vehicle 100 without performing estimation of a full charging capacity. In a second embodiment, when an amount of estimation results of full charging capacities collected from a plurality of vehicles 100 is insufficient and correlations thereof are not derived, a full charging capacity is estimated using measurement data in test which were performed in advance in the second estimation process.

In the second embodiment, only differences from the first embodiment will be described. An outline configuration of a battery control system and the hardware configuration and a functional configuration of a vehicle 100 are the same as in the first embodiment and thus description thereof will be omitted.

Figure 12:
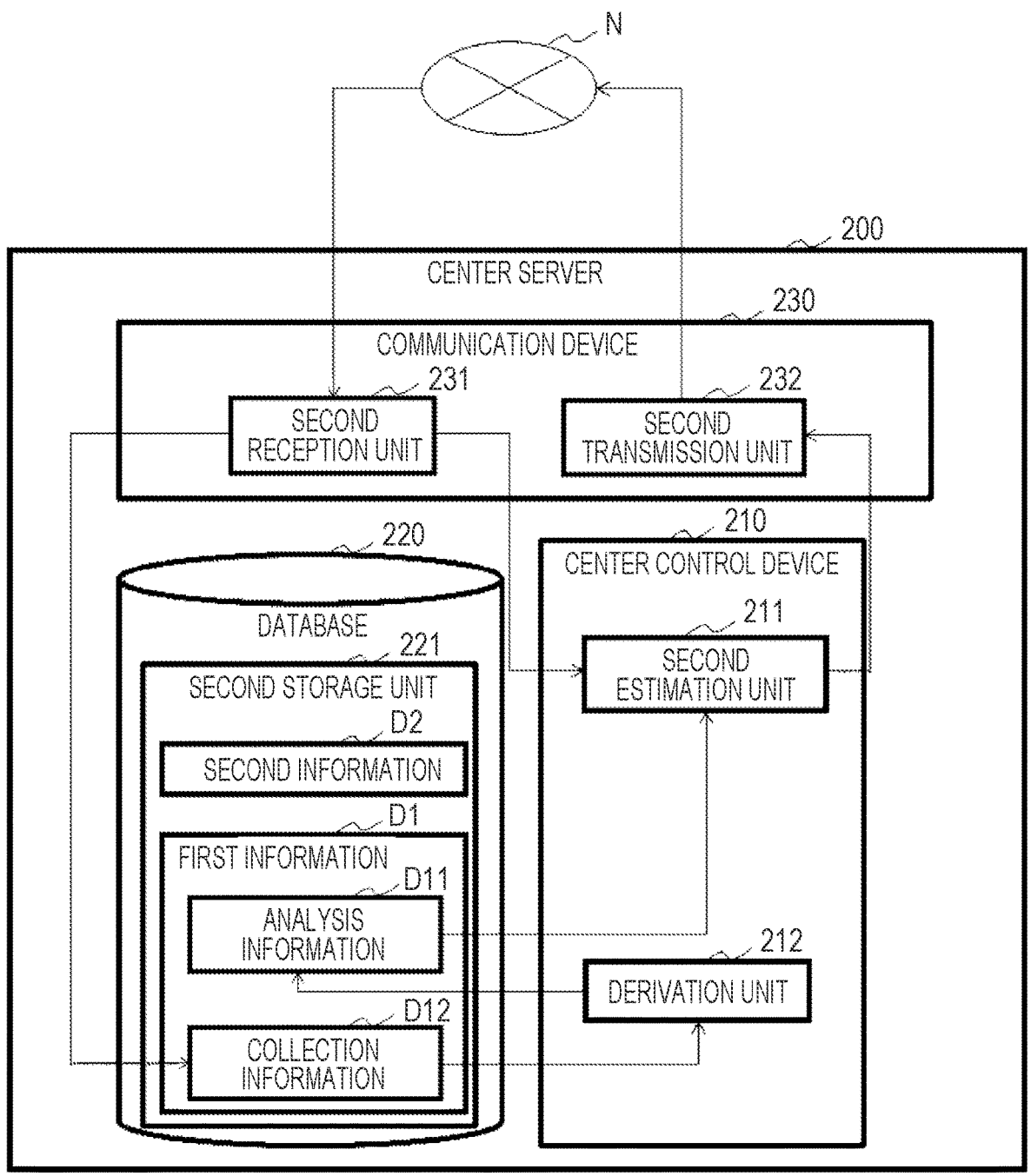
FIG. 12 is a block diagram illustrating a functional configuration of a center server according to a second embodiment.

FIG. 12 is a diagram illustrating a functional configuration of a management system according to the second embodiment. As illustrated in FIG. 12, a second storage unit 221 which is a functional unit of a center server 200 stores second information D2 on deterioration characteristics of a battery 110 which was acquired by testing batteries 110 in a plurality of vehicles 100 in advance in addition to first information D1 based on a first estimation result of a full charging capacity which is estimated by performing charging/discharging control of the batteries 110.

Figure 13:
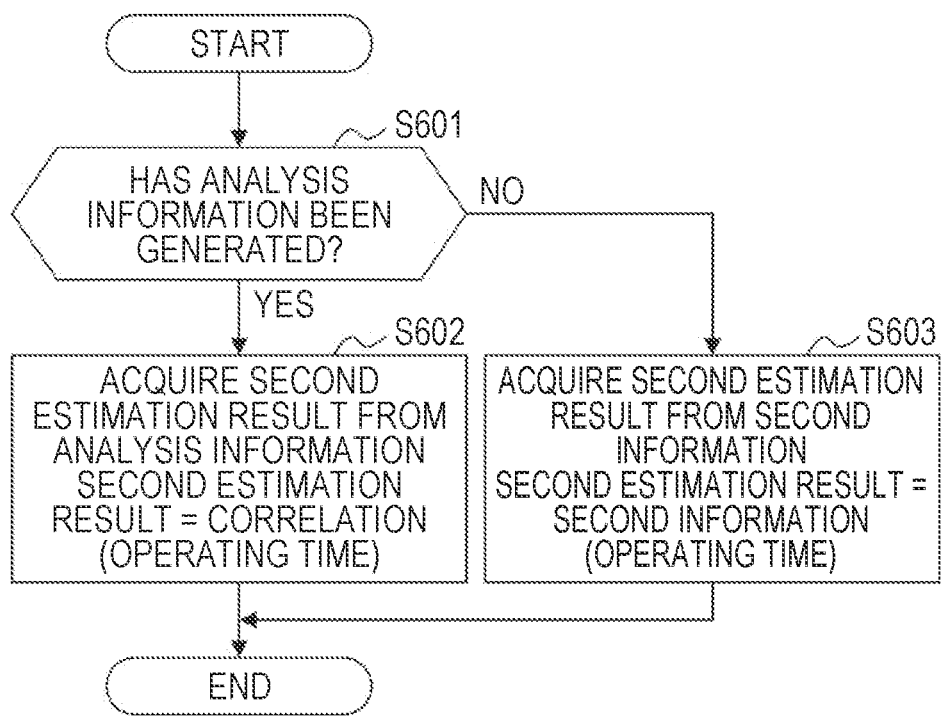
FIG. 13 is a flowchart illustrating a second estimation process which is performed by the center server according to the second embodiment.

FIG. 13 is a flowchart illustrating a second estimation process which is performed by the center server 200 according to the second embodiment. As illustrated in FIG. 13, the center server 200 according to the second embodiment additionally performs Step S603.

The second estimation process of estimating a full charging capacity which is performed by the center server 200 will be described below with reference to FIG. 13. In Step S601, the second estimation unit 211 determines whether analysis information D11 which is a correlation derived by the derivation unit 212 is stored in the second storage unit 221. When it is determined in Step S601 that the analysis information D11 which is the correlation derived by the derivation unit 212 is stored in the second storage unit 221, the control flow proceeds to Step S602. When it is determined in Step S601 that the analysis information D11 which is the correlation derived by the derivation unit 212 is not stored in the second storage unit 221, the control flow proceeds to Step S603. That is, when the number of pieces of collection information D12 from a plurality of vehicles 100 is not sufficient in the storage unit and the correlation is not derived, the control flow proceeds to Step S603.

In Step S603, the second estimation unit 211 estimates the full charging capacity of the battery 110 based on the operating time received along with the transmission request from a vehicle 100 by the second reception unit 231 and the second information D2 stored in the second storage unit.

Accordingly, even when an amount of estimation results of the full charging capacity collected from a plurality of vehicles 100 is not sufficient and a correlation is not derived, it is possible to estimate the full charging capacity of the battery 110 based on the second information D2. In comparison with a case in which full charging capacity estimation maps are individually provided for vehicles 100, a larger amount of information can be stored using the database 220 of the center server 200. Accordingly, although accuracy is lower than that of the first estimation result in the vehicles 100, it is possible to estimate the full charging capacity using the center server 200 and to update the estimation result of the full charging capacity.

Third Embodiment

In the first and second embodiments, the second estimation unit 211 is provided in the center server 200. In a third embodiment, the second estimation unit 211 is provided in a vehicle 100.

Figure 14:
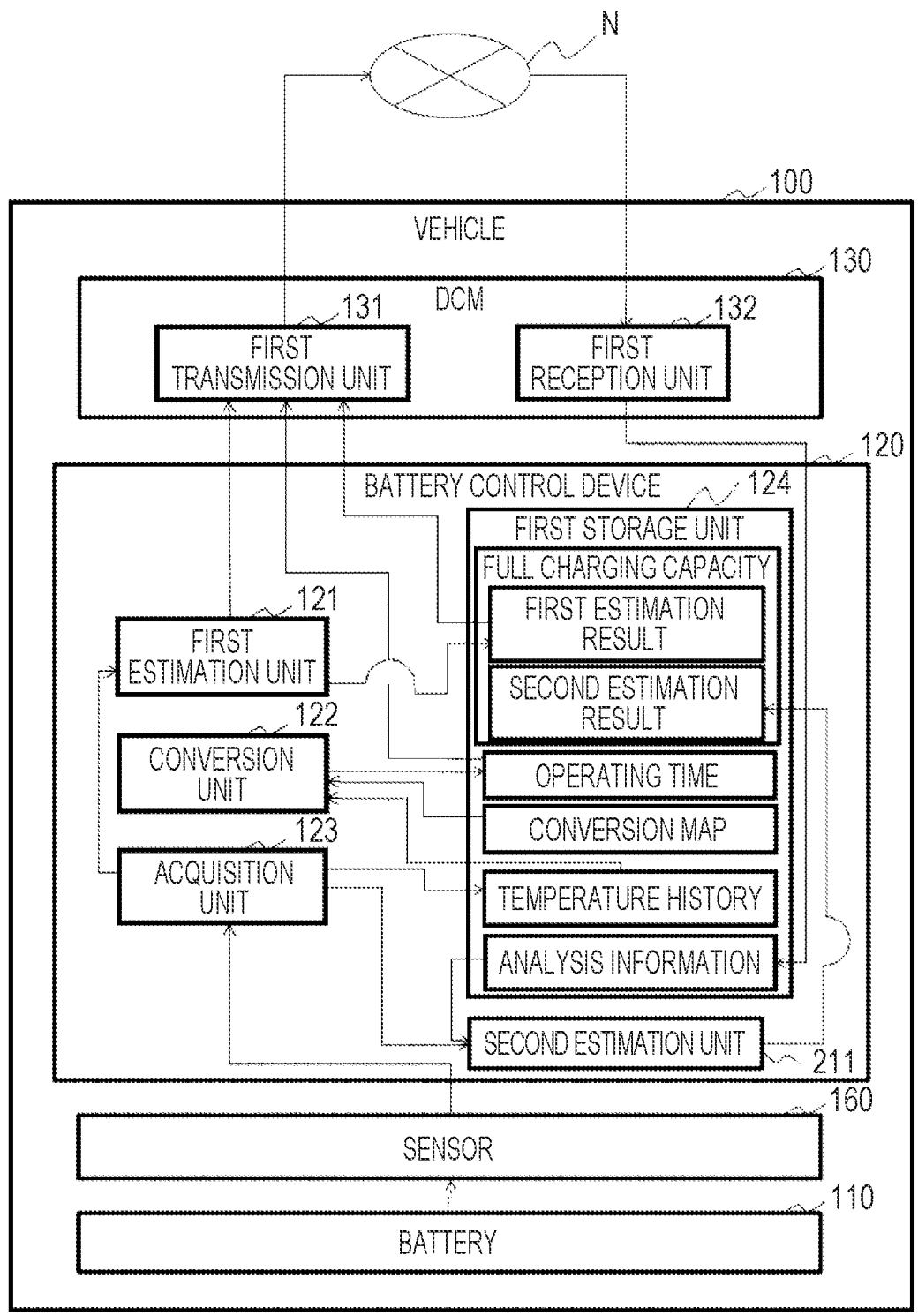
FIG. 14 is a block diagram illustrating a functional configuration of a vehicle according to a third embodiment.
Figure 15:
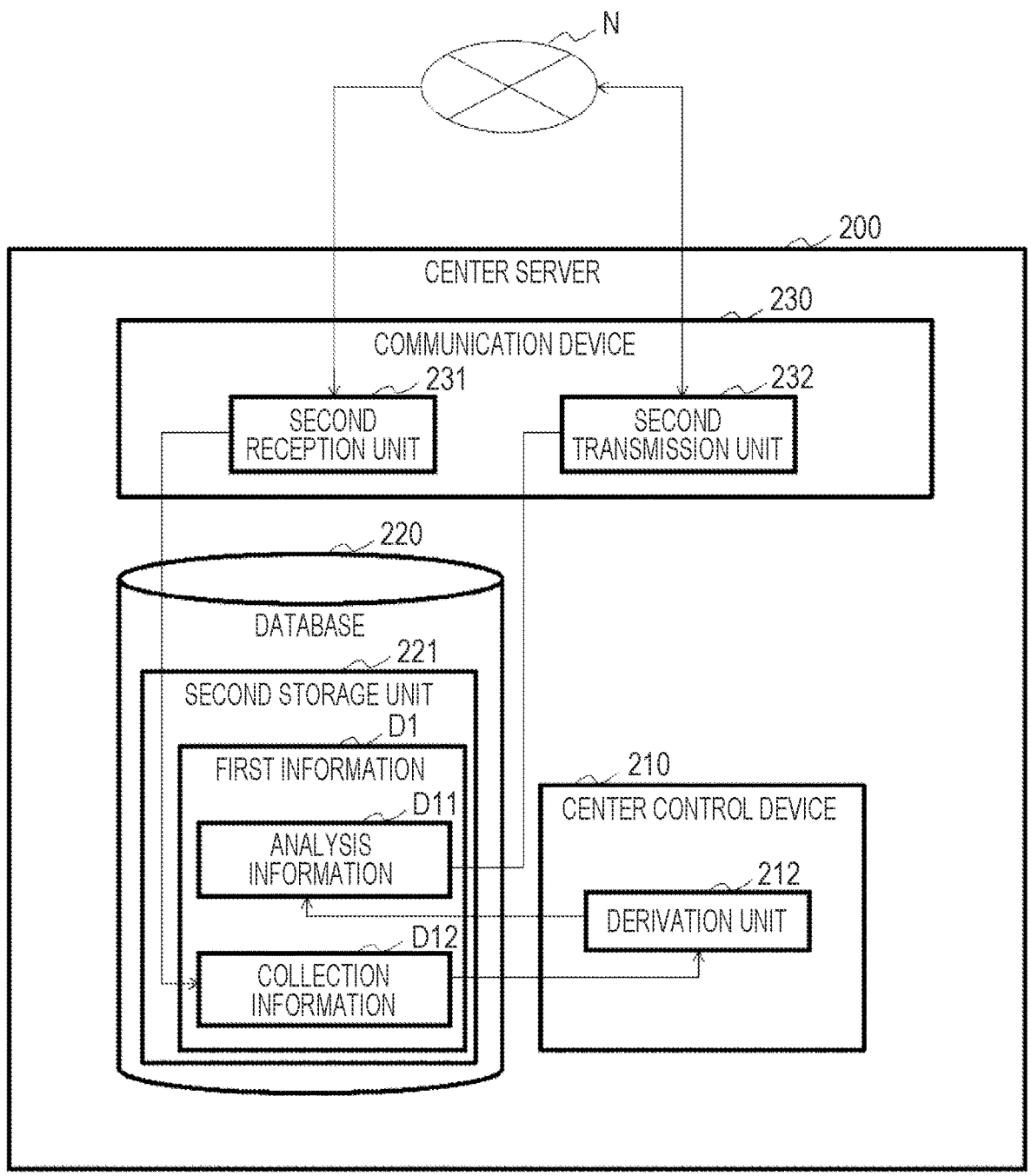
FIG. 15 is a block diagram illustrating a functional configuration of a center server according to the third embodiment.
Figure 16:
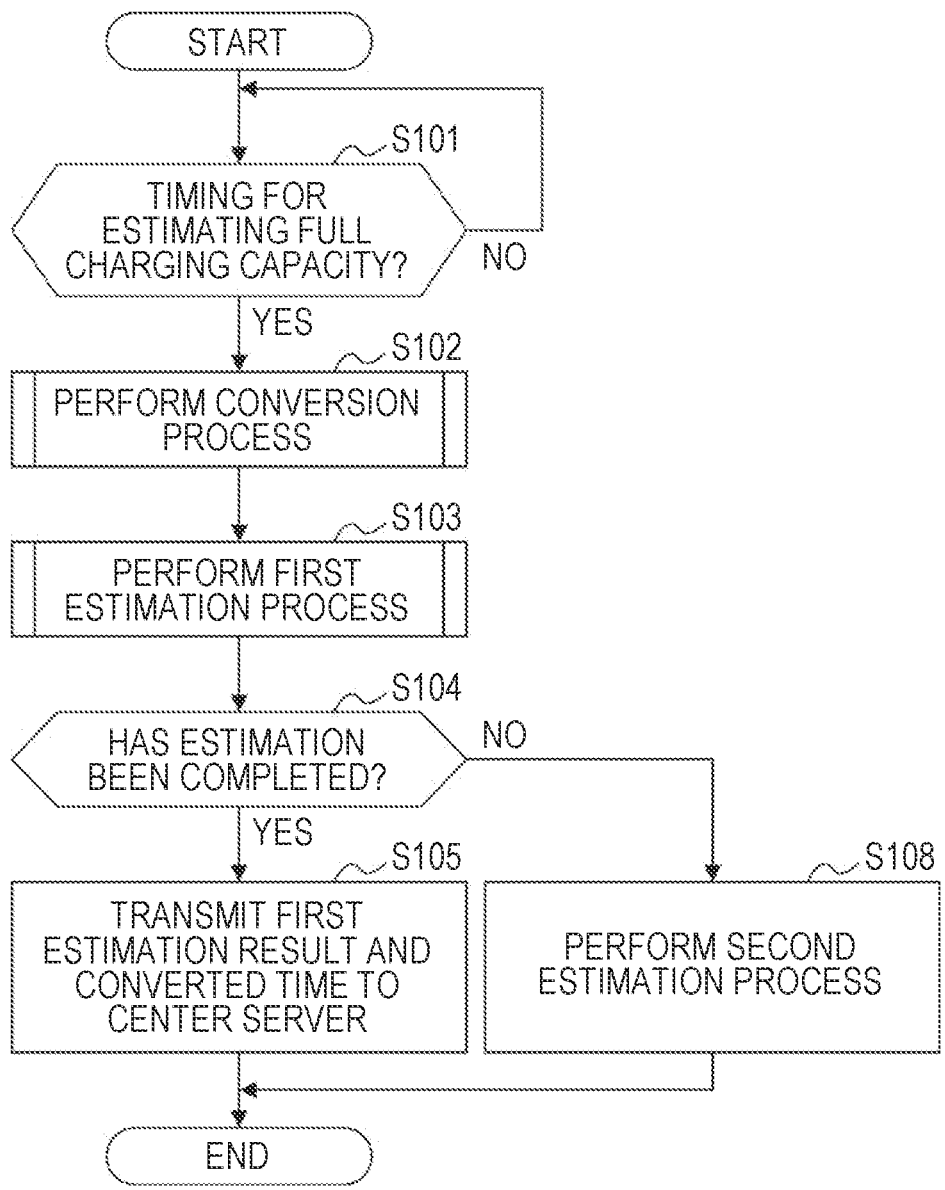
FIG. 16 is a flowchart illustrating a process which is performed in the vehicle according to the third embodiment.

In the third embodiment, only differences from the first embodiment will be described. An outline configuration of a battery control system is the same as in the first embodiment and thus description thereof will be omitted. As illustrated in FIG. 14 which is a diagram illustrating a functional configuration of a vehicle 100, the battery control device 120 of the vehicle 100 includes the second estimation unit 211. Instead, the second estimation unit 211 may not be provided in FIG. 15 which is a diagram illustrating a functional configuration of a center server 200. The battery control device 120 receives analysis information D11 from the center server 200 and stores the analysis information D11 in the first storage unit 124.

FIG. 13 is a flowchart illustrating a control flow which is performed by a vehicle 100 according to the third embodiment. As illustrated in FIG. 13, in the third embodiment, when it is determined in Step S104 that estimation of the first estimation process has not been completed, the control flow proceeds to S108 and a second estimation process is performed.

FIG. 17 is a flowchart illustrating a control flow which is performed by the center server 200 according to the third embodiment. As illustrated in FIG. 17, Step S407 and S408 are newly added in the third embodiment.

When it is determined in Step S401 that the second reception unit 231 has received vehicle information, the control flow proceeds to Step S405. In Step S405, the second storage unit 221 stores an operating time at a representative temperature of the battery 110 received from the vehicle 100 by the second reception unit 231 and a first estimation result of the full charging capacity as collection information D12. Subsequently, in Step S406, the derivation unit 212 performs a derivation process.

After the derivation process has been performed in Step S406, the control flow proceeds to Step S407. In Step S407, it is determined whether new analysis information D11 has been generated in the derivation process. When it is determined that new analysis information has been generated in the derivation process, that is, when the analysis information D11 has been updated with the stored collection information D12, the control flow proceeds to Step S408. When it is determined that new analysis information D11 has not been generated in the derivation process, the center server 200 ends the control flow. In Step S408, the center server 200 transmits the analysis information D11 to the vehicle 100 via the second transmission unit 232.

Accordingly, even when the first estimation process of estimating a full charging capacity in a vehicle 100 could not be performed and the vehicle 100 is not in an environment in which communication with the center server 200 is possible, it is possible to perform the second estimation process using the second estimation unit based on the analysis information D11 which has been received from the center server in advance.

Modified Examples

The aforementioned embodiments are described to facilitate understanding of the present disclosure, but not to limit the applicable embodiment. Accordingly, the elements disclosed in the aforementioned embodiments are intended to include all design modifications belonging to the technical scope of the present disclosure and equivalents thereto.

For example, in the aforementioned embodiments, the functional unit of the conversion unit 122 is provided in the vehicle 100, but the functional unit of the conversion unit 122 may be provided in the center server 200. In this case, the vehicle 100 can transmit temperature history information to the center server 200 and the center server 200 can convert the received temperature history information to an operating time.

Accordingly, since the conversion process of converting the temperature history to the operating time at the representative temperature does not need to be performed in the vehicle 100, it is possible to reduce a processing cost in the vehicle 100.

In the aforementioned embodiments, the operating time at the representative temperature of the battery 110 is used as information on the state quantity of the battery 110 which is transmitted and received between the vehicle 100 and the center server 200, but the state quantity may be information indicating only the number of times of charging/discharging or the operating time of the battery 110.

In the aforementioned embodiments, when the first estimation process of estimating the full charging capacity could not be performed in the vehicle 100, the state quantity of the battery 110 is transmitted to the center server 200 along with the transmission request, but the vehicle 100 may transmit only the transmission request without including the state quantity. In this case, the center server 200 stores information on an operation state such as the operating time of the battery 110 for each vehicle 100 in advance. When the transmission request is received, the center server 200 can identify the vehicle 100 based on identification information of the vehicle 100 included in the received transmission request, read information on operation for the vehicle 100 from the database 220, and estimate the full charging capacity.

Accordingly, when the first estimation process of the full charging capacity cannot be performed in the vehicle 100, it is possible to decrease an amount of information which is transmitted from the vehicle 100 to the management device.

In the aforementioned embodiments, the battery 110 is a high-voltage battery for driving in the hybrid vehicle 100, but may be an auxiliary-machinery battery. The battery 110 may be applied to a backup battery for backing up supply of electric power when a main battery malfunctions during automated driving. The predetermined condition for performing the first estimation process of a full charging capacity in the vehicle 100 can be individually set depending on batteries which are used.

What is claimed is:

1. A battery control system comprising:
a vehicle that includes a battery; and
a management device that is able to communicate with the vehicle,
wherein the vehicle includes:
an acquisition unit configured to acquire a state quantity of the battery;
a first estimation unit configured to perform an estimation process of estimating a full charging capacity of the battery based on the state quantity of the battery acquired by the acquisition unit by controlling charging or discharging of the battery;
a first transmission unit configured to transmit a transmission request for requesting transmission of an estimation result of the full charging capacity of the battery to the management device when the estimation process is not able to be performed by the first estimation unit; and
a first reception unit configured to receive an estimation result of the full charging capacity of the battery from the management device, and
wherein the management device includes:
a second reception unit configured to receive the transmission request from the vehicle;
a second estimation unit configured to estimate the full charging capacity of the battery when the transmission request has been received by the second reception unit; and
a second transmission unit configured to transmit the full charging capacity of the battery estimated by the second estimation unit to the vehicle.

2. The battery control system according to claim 1, wherein the first transmission unit is configured to transmit the transmission request and the state quantity of the battery acquired by the acquisition unit to the management device when the estimation process is not able to be performed by the first estimation unit,
wherein the second reception unit is configured to receive the transmission request and the state quantity of the battery from the vehicle, and
wherein the second estimation unit is configured to estimate the full charging capacity of the battery based on the received state quantity of the battery when the transmission request has been received by the second reception unit.

3. The battery control system according to claim 1, wherein the first transmission unit is configured to transmit the state quantity of the battery acquired by the acquisition unit and the first estimation result of the full charging capacity of the battery estimated by the first estimation unit to the management device when the estimation process has been performed by the first estimation unit.

4. The battery control system according to claim 3, wherein the management device further includes a derivation unit configured to classify the state quantity of the battery and the first estimation result in a plurality of vehicles received by the second reception unit according to the state quantity of the battery and to derive a correlation between the classified state quantity of the battery and the full charging capacity of the battery, and
wherein the second estimation unit is configured to estimate the full charging capacity of the battery based on the received state quantity of the battery and the correlation derived by the derivation unit when the transmission request has been received by the second reception unit.

5. The battery control system according to claim 4, wherein the vehicle further includes a conversion unit configured to convert a history of a temperature of the battery acquired by the acquisition unit to an operating time when the battery is used at a predetermined representative temperature,
wherein the first transmission unit is configured to transmit the operating time converted by the conversion unit as the state quantity of the battery to the management device,
wherein the second reception unit is configured to receive the operating time from the vehicle, and
wherein the derivation unit is configured to derive a correlation between the operating time and the full charging capacity of the battery as the correlation.

6. The battery control system according to claim 4, wherein the first transmission unit is configured to transmit a history of a temperature of the battery acquired by the acquisition unit as the state quantity of the battery to the management device,
wherein the second reception unit is configured to receive the history of the temperature of the battery from the vehicle,
wherein the management device further includes a conversion unit configured to convert the history of the temperature of the battery received by the second reception unit to an operating time when the battery is used at a predetermined representative temperature, and
wherein the derivation unit is configured to derive a correlation between the operating time and the full charging capacity of the battery as the correlation.

7. The battery control system according to claim 1, wherein the first estimation unit is configured to control charging or discharging of the battery when a first condition of the vehicle has been satisfied, and
wherein the first transmission unit is configured to determine that the estimation process is not able to be performed by the first estimation unit and to transmit the transmission request to the management device when a second condition of the vehicle has not been satisfied while the first estimation unit is controlling charging or discharging of the battery.

8. A battery control method that is performed by a vehicle that includes a battery and a management device that is able to communicate with the vehicle,
wherein the vehicle performs:
acquiring a state quantity of the battery;
performing an estimation process of estimating a full charging capacity of the battery based on the acquired state quantity of the battery by controlling charging or discharging of the battery;
transmitting a transmission request for requesting transmission of an estimation result of the full charging capacity of the battery to the management device when the estimation process is not able to be performed; and
receiving an estimation result of the full charging capacity of the battery from the management device, and
wherein the management device performs:
receiving the transmission request from the vehicle;
estimating the full charging capacity of the battery when the transmission request has been received; and
transmitting the estimation result of the full charging capacity of the battery to the vehicle.

9. A non-transitory storage medium having stored thereon a battery control program that is used for a battery control system comprising a vehicle that includes a battery and a management device that is able to communicate with
the vehicle, the battery control program causing the vehicle to perform:
acquiring a state quantity of the battery;
performing an estimation process of estimating a full charging capacity of the battery based on the acquired state quantity of the battery by controlling charging or discharging of the battery;
transmitting a transmission request for requesting transmission of an estimation result of the full charging capacity of the battery to the management device when the estimation process is not able to be performed; and
receiving an estimation result of the full charging capacity of the battery from the management device, and
the battery control program causing the management device to perform:
receiving the transmission request from the vehicle;
estimating the full charging capacity of the battery when the transmission request has been received; and
transmitting the estimation result of the full charging capacity of the battery to the vehicle.

10. A vehicle including a battery and being able to communicate with an external management device, the vehicle comprising:
an acquisition unit configured to acquire a state quantity of the battery;
a first estimation unit configured to perform an estimation process of estimating a full charging capacity of the battery based on the state quantity of the battery acquired by the acquisition unit by controlling charging or discharging of the battery;
a first transmission unit configured to transmit a transmission request for requesting transmission of an estimation result of the full charging capacity of the battery to the management device when the estimation process is not able to be performed by the first estimation unit; and
a first reception unit configured to receive an estimation result of the full charging capacity of the battery from the management device.

11. A battery control system comprising:
a vehicle that includes a battery; and
a management device that is able to communicate with the vehicle,
wherein the vehicle includes:
an acquisition unit configured to acquire a state quantity of the battery;
a first estimation unit configured to perform an estimation process of estimating a full charging capacity of the battery based on the state quantity of the battery acquired by the acquisition unit by controlling charging or discharging of the battery;
a first transmission unit configured to transmit the state quantity of the battery acquired by the acquisition unit and a first estimation result of the full charging capacity of the battery estimated by the first estimation unit to the management device when the estimation process is able to be performed by the first estimation unit;
a first reception unit configured to receive a correlation between the state quantity of the battery and the full charging capacity of the battery from the management device; and
a second estimation unit configured to estimate the full charging capacity of the battery based on the state quantity of the battery and the correlation received by the first reception unit when the estimation process is not able to be performed by the first estimation unit, and
wherein the management device includes:
a second reception unit configured to receive the state quantity of the battery and the first estimation result estimated by the first estimation unit from the vehicle;
a derivation unit configured to derive the correlation based on the state quantity of the battery and the first estimation result received by the second reception unit; and
a second transmission unit configured to transmit the correlation derived by the derivation unit to the vehicle.

* * * * *